United States Patent
Onose et al.

(10) Patent No.: US 9,791,780 B2
(45) Date of Patent: Oct. 17, 2017

(54) EXPOSURE APPARATUS

(71) Applicant: Gigaphoton Inc., Oyama-shi, Tochigi (JP)

(72) Inventors: Takashi Onose, Oyama (JP); Kouji Kakizaki, Oyama (JP); Osamu Wakabayashi, Oyama (JP); Akiyoshi Suzuki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 17 days.

(21) Appl. No.: 14/983,962

(22) Filed: Dec. 30, 2015

(65) Prior Publication Data

US 2016/0187788 A1   Jun. 30, 2016

Related U.S. Application Data

(63) Continuation of application No. PCT/JP2014/068722, filed on Jul. 14, 2014.

(30) Foreign Application Priority Data

Jul. 18, 2013  (WO) .................. PCT/JP2013/069554

(51) Int. Cl.
   *G03B 27/42*   (2006.01)
   *G03B 27/54*   (2006.01)
   *G03F 7/20*    (2006.01)

(52) U.S. Cl.
   CPC ........ *G03F 7/70058* (2013.01); *G03F 7/7035* (2013.01); *G03F 7/70408* (2013.01); *G03F 7/70575* (2013.01)

(58) Field of Classification Search
   CPC .................................................. G03F 7/70058
   (Continued)

(56) References Cited

U.S. PATENT DOCUMENTS 4,656,347 A * 4/1987 Une ..................... G03F 9/7023
                                                   250/237 G
5,114,236 A * 5/1992 Matsugu ............... G03F 9/7076
                                                   250/548
(Continued)

FOREIGN PATENT DOCUMENTS

JP       1994-188176 A     7/1994
JP       2004-069398 A     3/2004
(Continued)

OTHER PUBLICATIONS

Harun H. Solak et al., Displacement Talbot lithography: a new method for high-resolution patterning of large areas, Optics Express, May 16, 2011, pp. 10686-10691, vol. 19, No. 11, Eulitha AG, Switzerland.

(Continued)

*Primary Examiner* — Hung Henry Nguyen
(74) *Attorney, Agent, or Firm* — Studebaker & Brackett PC

(57) ABSTRACT

An exposure apparatus may include a laser light source capable of varying a wavelength of a laser beam that is emitted from the laser light source, a mask on which a pattern is formed, the pattern being configured to generate diffracted light by being irradiated with the laser beam, and a controller configured to control, in accordance with a distance between the mask and a substrate, the wavelength of the laser beam that is emitted from the laser light source, wherein the mask is irradiated with the laser beam emitted from the laser light source to perform proximity exposure on a surface of the substrate.

17 Claims, 24 Drawing Sheets

(58) Field of Classification Search
USPC ......... 355/53, 67–71; 250/548; 356/399–401
See application file for complete search history.

(56) References Cited

U.S. PATENT DOCUMENTS

| | | | | |
|---|---|---|---|---|
| 5,355,219 | A * | 10/1994 | Araki | G03F 9/70 |
| | | | | 356/490 |
| 6,078,641 | A * | 6/2000 | Mitsui | G03F 7/70058 |
| | | | | 378/210 |
| 2001/0046315 | A1 * | 11/2001 | Sentoku | G03F 7/70775 |
| | | | | 382/151 |
| 2007/0274633 | A1 | 11/2007 | Raub et al. | |
| 2007/0279637 | A1 * | 12/2007 | Hill | G03F 1/78 |
| | | | | 356/486 |
| 2008/0186579 | A1 | 8/2008 | Solak | |
| 2012/0009525 | A1 | 1/2012 | Clube et al. | |

FOREIGN PATENT DOCUMENTS

| | | |
|---|---|---|
| JP | 2007-286411 A | 11/2007 |
| JP | 2008-517472 A | 5/2008 |
| JP | 2013-016696 A | 1/2013 |
| JP | 2013-051292 A | 3/2013 |
| WO | 2012-049638 A1 | 4/2012 |

OTHER PUBLICATIONS

Takashi Sato, Talbot effect immersion lithography by self-imaging of very fine grating patterns, American Vacuum Society, Nov. 2012, pp. 06FG02-1-06FG02-5, Japan.
International Search Report issued in PCT/JP2014/068722 dated Oct. 7, 2014.

* cited by examiner

| p [nm] | D [mm] |
|---|---|
| 200 | 0.4 |
| 250 | 0.6 |
| 300 | 1.0 |
| 400 | 1.8 |
| 500 | 2.8 |
| 750 | 6.5 |
| 1000 | 11.7 |
| 1300 | 19.8 |
| 1600 | 30.0 |

| p [nm] | D [mm] |
|---|---|
| 250 | 0.2 |
| 350 | 0.5 |
| 500 | 1.2 |
| 600 | 1.8 |
| 700 | 2.6 |
| 750 | 3.0 |
| 1000 | 5.5 |
| 1300 | 9.4 |
| 1600 | 14.4 |

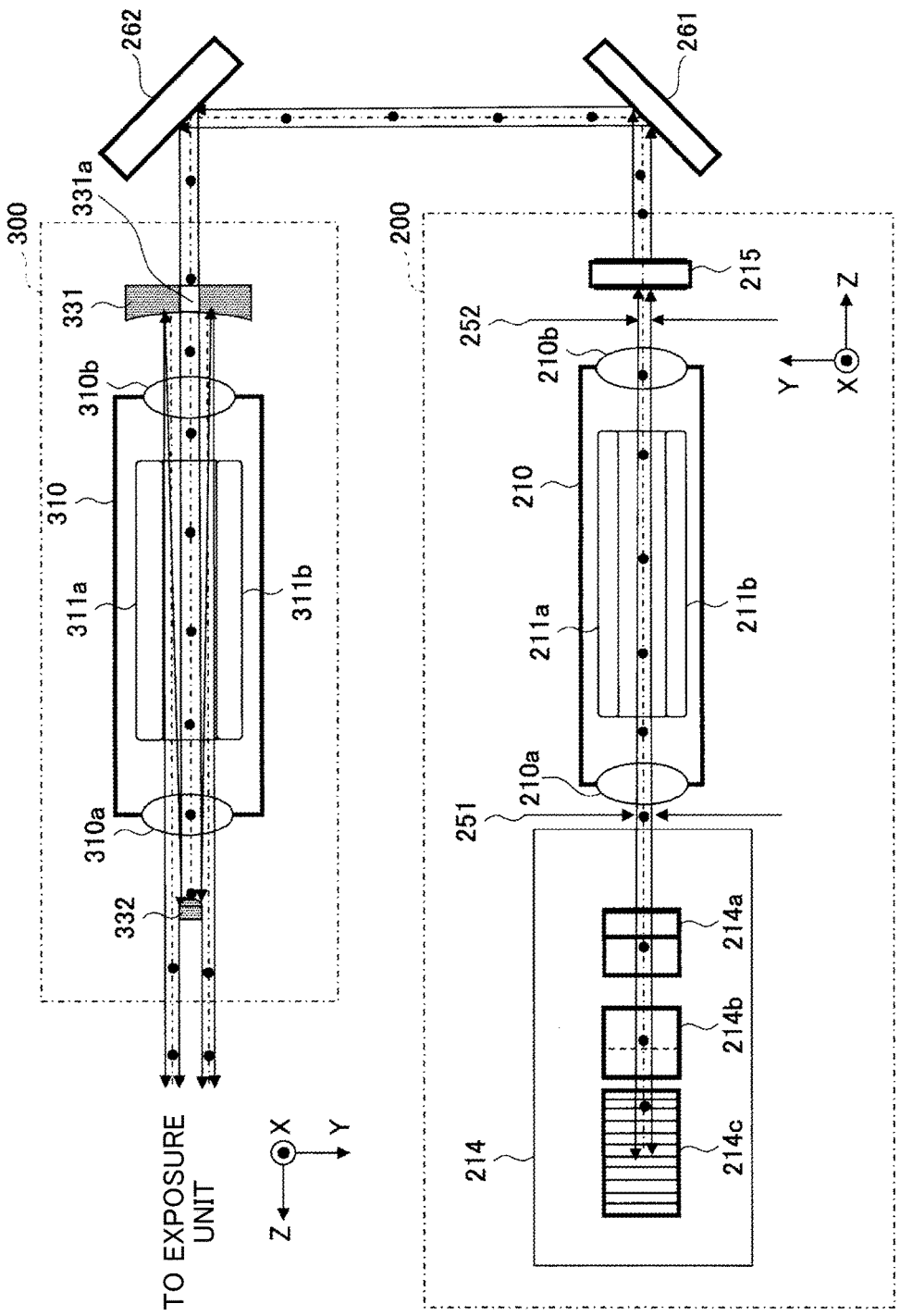

EXPOSURE APPARATUS

TECHNICAL FIELD

The present disclosure relates to an exposure apparatus.

BACKGROUND ART

Along with miniaturization and higher integration of semiconductor integrated circuits, a semiconductor exposure apparatus (hereinafter referred to as "exposure apparatus") has been required to have higher resolving power. For this reason, shortening of the wavelength of light that is emitted from an exposure light source is under development. As an exposure light source, a gas laser apparatus is used instead of a conventional mercury lamp. Currently, as a gas laser apparatus for exposure, a KrF excimer laser apparatus configured to emit ultraviolet light with a wavelength of 248 nm or an ArF excimer laser apparatus configured to emit ultraviolet light with a wavelength of 193 nm is used.

As current exposure technology, immersion exposure has been put to practical use. In the immersion exposure, a gap between an exposure lens in an exposure apparatus and a wafer is filled with fluid, thereby an apparent wavelength of the exposure light source is shortened by changing the refractive index. In a case where immersion exposure is performed using an ArF excimer laser apparatus as an exposure light source, a wafer is irradiated with ultraviolet light whose wavelength in water is equivalent to 134 nm. This technique is referred to as "ArF immersion exposure (or ArF immersion lithography)".

Natural oscillation amplitudes of KrF and ArF excimer laser apparatuses are as wide as approximately 350 to 400 pm. Therefore, use of the exposure lens causes chromatic aberration, thus lowering the resolving power. Therefore, a spectrum line width (spectrum width) of a laser beam that is emitted from a gas laser apparatus needs to be narrowed to such an extent that chromatic aberration can be ignored. For this reason, narrowing of a spectrum width is achieved by providing, in a laser resonator of a gas laser apparatus, a line narrow module having a line narrow element (an etalon, a grating, or the like). A laser apparatus whose spectrum width is narrowed in this way is referred to as "line narrowed laser apparatus".

As means for fine pattern exposure using a KrF or ArF excimer laser apparatus, an exposure apparatus configured to perform exposure using the Talbot effect has been proposed.

PATENT REFERENCE 1

Japanese Patent Application Publication No. 2013-51292 A

PATENT REFERENCE 2

United States Patent Application Publication No. 2007/0274633 A1

PATENT REFERENCE 3

United States Patent Application Publication No. 2012/0009525 A1

NON-PATENT REFERENCE 1

Harun H. Solak, Christian Dais, and Francis Clube, Displacement Talbot lithography: a new method for high-resolution patterning of large areas, 23 May 2011/Vol. 19, No. 11/*OPTICS EXPRESS* 10686

NON-PATENT REFERENCE 2

Takashi Sato, Talbot effect immersion lithography by self-imaging of very fine grating patterns, 06FG02-1 *J. Vac. Sci. Technol.* B 30(6), November/December 2012

SUMMARY

An exposure apparatus according to the present disclosure may be configured to perform proximity exposure on a surface of a substrate. The exposure apparatus may include: a laser light source capable of varying a wavelength of a laser beam that is emitted from the laser light source; a mask on which a pattern is formed, the pattern being configured to generate diffracted light by being irradiated with the laser beam, the mask being irradiated with the laser beam emitted from the laser light source; and a controller configured to control, in accordance with a distance between the mask and the substrate, the wavelength of the laser beam that is emitted from the laser light source.

BRIEF DESCRIPTION OF DRAWINGS

Hereinafter, selected embodiments of the present disclosure will be described with reference to the accompanying drawings by way of example.

FIG. 24 is a structural drawing of Variation 2 of the laser apparatus for use in the exposure apparatus according to the present disclosure.

DESCRIPTION OF EMBODIMENTS

Figure 1:
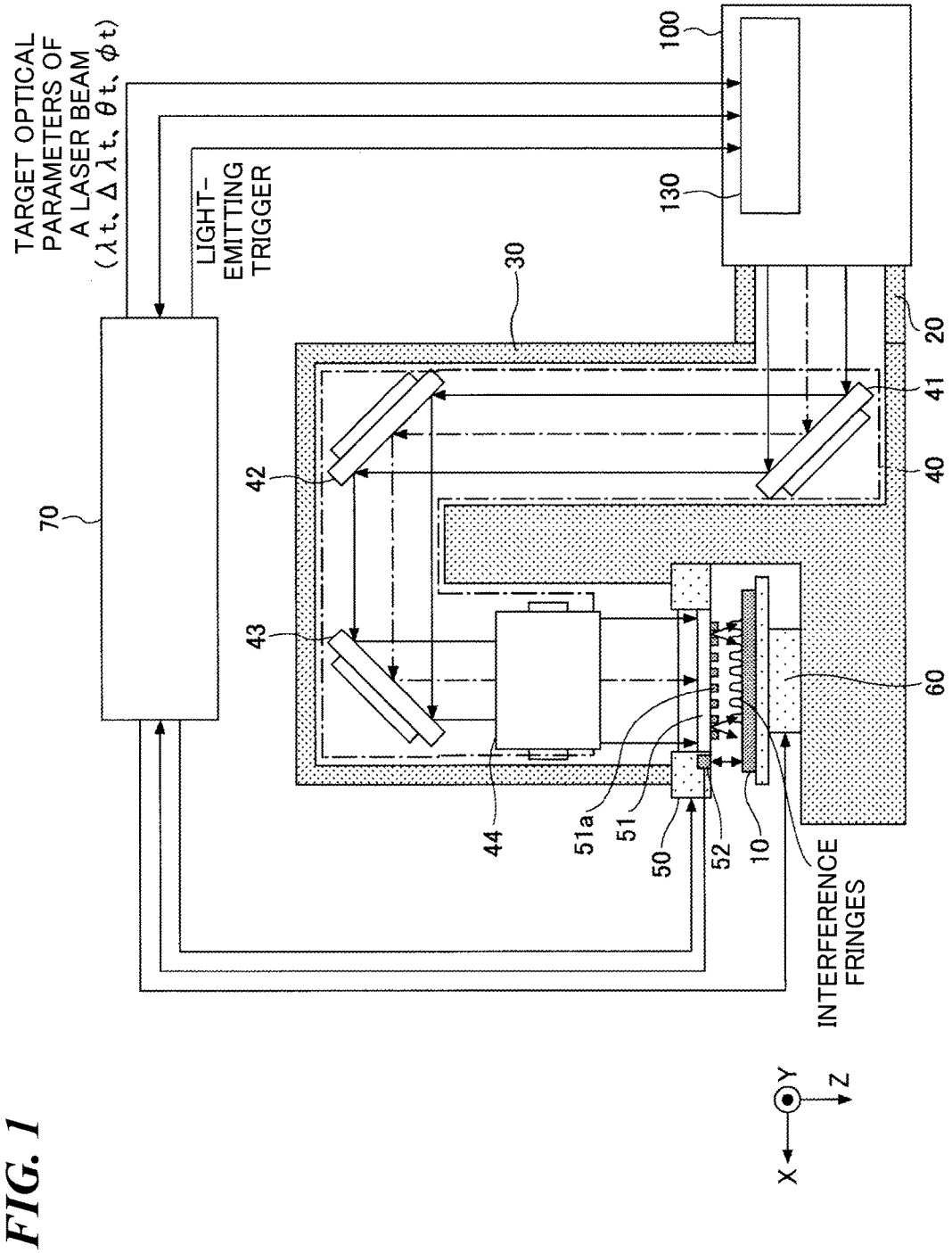
FIG. 1 is a schematic view of a configuration of an exemplary exposure apparatus according to an aspect of the present disclosure.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Corresponding elements may be referenced by corresponding reference numerals and characters, and duplicate descriptions thereof may be omitted.

TABLE OF CONTENTS

1. Description of terms
2. Exposure apparatus
   2.1 Problems
   2.2 Configuration
   2.3 Operation
   2.4 Working effects
   2.5 Exposure by the Talbot effect
      2.5.1 ArF excimer laser
      2.5.2 KrF excimer laser
      2.5.3 Relationship between the spectrum line width $\Delta\lambda$ of a pulse laser beam and the depth of focus DOF
      2.5.4 Direction of polarization of a pulse laser beam
3. Laser light source
   3.1 Configuration
   3.2 Operation
   3.3 Working effects
   3.4 Others
4. Control of the laser light source
   4.1 A first method for controlling the laser light source
   4.2 A second method for controlling the laser light source
   4.3 A third method for controlling the laser light source
   4.4 A fourth method for controlling the laser light source
   4.5 A fifth method for controlling the laser light source
   4.6 Control in the laser controller
   4.7 Control in the wavelength controller
5. Variations of the laser light source
   5.1 Variation 1 of the laser light source
   5.2 Variation 2 of the laser light source
   5.3 Variation 3 of the laser light source
   5.4 Variation 4 of the laser light source
6. Beam forming unit
   6.1 Example 1 of the beam forming unit
   6.2 Example 2 of the beam forming unit
7. Controller 1. Description of Terms The terms as used herein are defined as follows. The term "optical path" refers to a path along which a laser beam passes. The term "optical path length" refers to the product of the distance that light actually passes and the refractive index of a medium through which the light has passed. The term "amplification wavelength region" refers to a band of wavelengths in which a laser beam can be amplified when it has passed through an amplification region.

The term "upstream" refers to an optical path of a laser beam that is closer to a light source. The term "downstream" refers to an optical path of a laser beam that is closer to an exposure side. The term "optical path axis" may refer to an axis passing through substantially the center of a beam cross-section of a laser beam along the direction that the laser beam travels.

2. Exposure Apparatus 2.1 Problems

An exposure apparatus performing exposure using the Talbot effect is an apparatus configured to perform exposure by irradiating a predetermined mask pattern with light of high-coherence from a light source to thereby form an interference pattern on a surface of a wafer placed in a position at an integer multiple of a predetermined distance. In the present disclosure, the predetermined distance may be referred to as "Talbot distance".

Such an exposure apparatus configured to perform exposure using the Talbot effect can form an interference pattern by adjusting the distance between the mask and the wafer so that the distance is equal to an integer multiple of the Talbot distance. For this reason, there has been a demand for control of a wafer stage configured to make high-accuracy position adjustments with respect to a height (Z-axis) direction of the wafer. Further, there has also been a demand for free control of the depth of focus. Furthermore, there has been a case where imaging performance varies depending on the state of polarization of the irradiating laser.

2.2 Configuration

FIG. 1 shows an exposure apparatus according to an aspect of the present disclosure. In the present disclosure, an "excimer laser light source" for use in the exposure apparatus may be referred to simply as a "laser light source".

The exposure apparatus shown in FIG. 1 may be an exposure apparatus configured to cause a photo-resist applied onto a surface of a wafer 10, which is a substrate, to be exposed by interference caused by the Talbot effect. The exposure apparatus may include a laser light source 100, an optical path tube 20, a frame 30, an optical system 40, a mask stage 50, a wafer stage 60, and a controller 70. A mask 51 may be fixed onto the mask stage 50. In the following description, the optical path tube 20, the frame 30, the optical system 40, the mask stage 50, the wafer stage 60, and the controller 70 may be collectively referred to as an "exposure unit".

The exposure apparatus according to the present disclosure may be a proximity exposure apparatus configured to perform exposure with the mask 51 and the wafer 10 in proximity to each other with no optical system interposed therebetween. Specifically, with the mask 51 and the wafer 10 placed at a short distance, for example, of approximately 0.28 mm to several millimeters from each other, the mask 51 may be irradiated with a pulse laser beam so that a photo-resist applied onto the surface of the wafer 10 may be exposed.

The laser light source 100 may, for example, be an ArF laser light source configured to output a pulse laser beam with a wavelength of 193 nm. The optical path tube 20 may connect the laser light source 100 and the frame 30.

The optical system 40 may include a first high-reflectance mirror 41, a second high-reflectance mirror 42, a third high-reflectance mirror 43, and a beam forming unit 44.

The beam forming unit 44 may, for example, be an optical element configured to convert a pulse laser beam of a plane wave with a profile of a Gaussian beam into a pulse laser beam with a beam profile with a top-hat shape while maintaining the plane wave. The beam forming unit 44 may, for example, be an optical element including a combination of an aspherical concave lens and an aspherical convex lens.

The first high-reflectance mirror 41, the second high-reflectance mirror 42, the third high-reflectance mirror 43, and the beam forming unit 44 may be placed within the frame 30 so that the surface of the wafer 10 may be uniformly irradiated with a pulse laser beam emitted from the laser light source 100.

Figure 2:
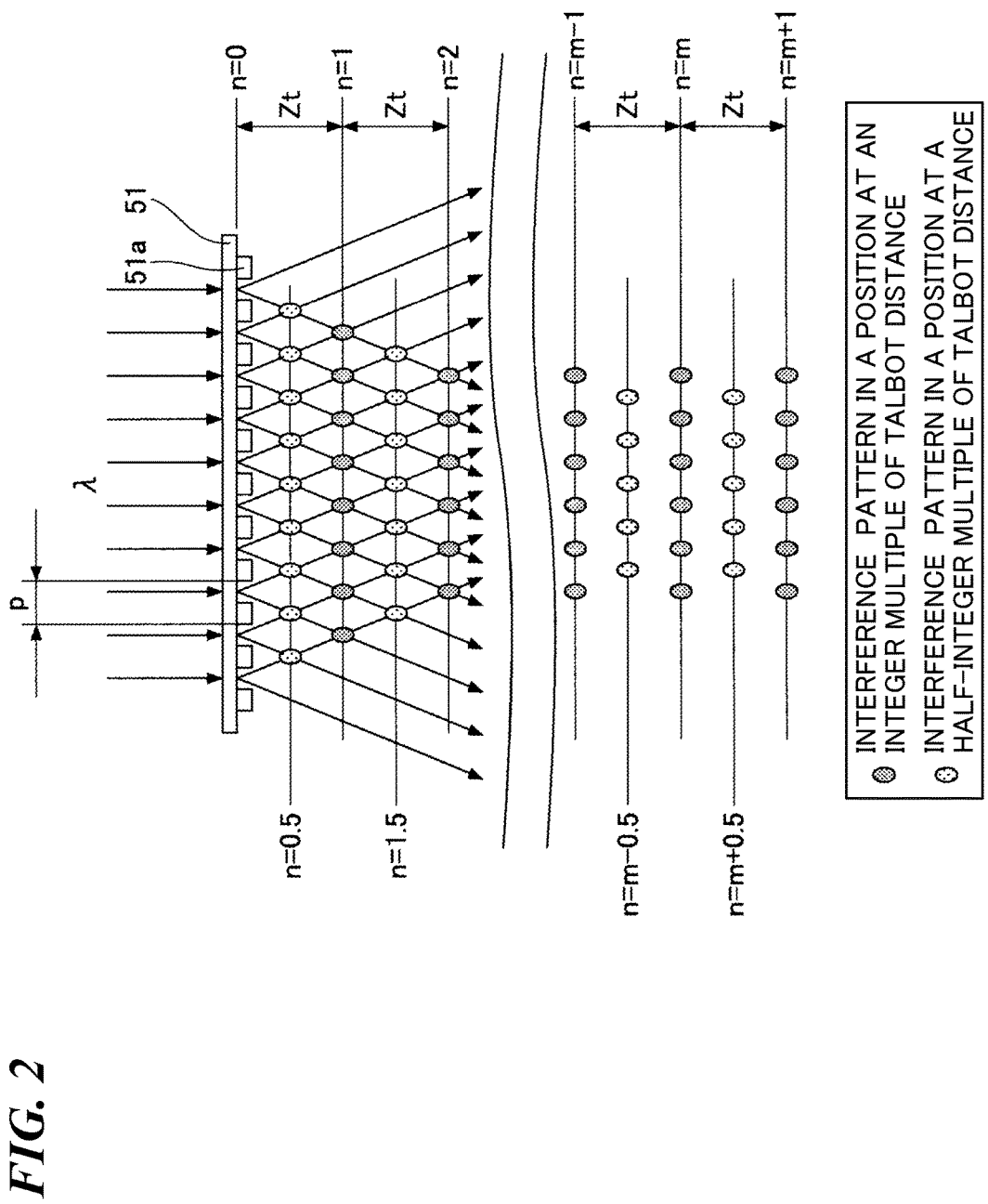
FIG. 2 is an explanatory diagram of exposure by the Talbot effect.

A mask pattern that is formed on the mask 51 may be configured to generate diffracted light so that exposure by the Talbot effect may be performed by the interference of the diffracted light. Therefore, as shown in FIG. 2, a periodic pattern 51a having a periodic structure of lines and spaces (L&S) may be formed on the mask 51 at predetermined periods. Further, the mask 51 may be a phase grating including a quartz substrate with grooves cut at predetermined pitches.

The wafer 10 may be fixed onto the wafer stage 60. A photo-resist may be applied onto the surface of the wafer 10.

The mask 51 and the wafer 10 may be placed so that the distance therebetween is equal to an integer multiple of the Talbot distance Zt. The mask stage 50 may be provided with a distance sensor 52 configured to measure the distance between the mask 51 and the wafer 10. The distance sensor 52 may be configured to measure the distance by utilizing the interference of a laser beam.

The laser light source 100 may be a laser light source capable of varying either a wavelength or a spectrum line width or both the wavelength and the spectrum line width as optical parameters of a pulse laser beam that is emitted. Furthermore, the laser light source 100 may be a laser light source capable of varying a state of polarization. The laser light source 100 may be provided with a laser controller 130.

2.3 Operation

When a wafer 10 onto which a photo-resist has been applied is placed on the wafer stage 60, the distance sensor 52 may be controlled by the controller 70 to measure the distance MD between the mask 51 and the wafer 10 and send information on the distance thus measured to the controller 70.

The controller 70 may calculate, in accordance with the distance MD between the mask 51 and the wafer 10 as measured by the distance sensor 52, such a target wavelength $\lambda t$ that the distance MD is equal to an integer multiple of the Talbot distance Zt. The target wavelength $\lambda t$ thus calculated may be sent from the controller 70 to the laser controller 130 of the laser light source 100.

The controller 70 may calculate a target spectrum line width $\Delta \lambda t$ of a pulse laser beam so that a predetermined depth of focus can be achieved. The target spectrum line width $\Delta \lambda t$ thus calculated may be sent from the controller 70 to the laser controller 130 of the laser light source 100. The spectrum line width may for example be a half-value width of the spectrum of a pulse laser beam that is emitted or a width of a range within which 95% of the total energy falls.

Further, the controller 70 may calculate a target polarization plane angle $\theta t$, which may be a target angle of a direction of polarization, and/or a target phase difference $\phi t$, so that a predetermined resolution can be achieved. The controller 70 may send information on the target polarization plane angle $\theta t$ and/or the target phase difference $\phi t$ to the laser controller 130 of the laser light source 100.

The controller 70 may send signals to the laser controller 130 so that the laser light source 100 may perform laser oscillation at a repetition frequency f with a predetermined pulse energy P.

A pulse laser beam emitted from the laser light source 100 may be a substantially plane wave, and may be highly reflected by the first high-reflectance mirror 41, the second high-reflectance mirror 42, and the third high-reflectance mirror 43 to enter the beam forming unit 44.

The pulse laser beam having entered the beam forming unit 44 may be converted in the beam forming unit 44 to have a beam profile with a top-hat shape with the plane wave maintained. The mask 51 may be uniformly irradiated with this top-hat pulse laser beam. The light transmitted through the mask 51 may form interference fringes on the surface of the wafer 10 placed in a position at an integer multiple of the Talbot distance Zt, and the photo-resist may be exposed to the light.

2.4 Working Effects

In the exposure apparatus according to the present disclosure, by controlling the wavelength of a pulse laser beam, the position of imaging by the pulse laser beam may be varied with a high degree of accuracy to be a predetermined position. Further, by controlling the spectrum line width, the depth of focus in the imaging position of the pulse laser beam may be freely varied. Furthermore, by controlling the polarization of the pulse laser beam in accordance with the periodic pattern 51a on the mask 51, a high resolving power may be maintained.

2.5 Exposure by the Talbot Effect 2.5.1 ArF Excimer Laser

Next, interference caused by the Talbot effect in the exposure apparatus according to the present disclosure is described with reference to FIG. 2. The description is given by taking, as an example, a case where an ArF excimer laser is used as the laser light source 100.

The periodic pattern 51a formed on the mask 51 may generate diffracted light such as ±first-order light, and the diffracted light thus generated may form interference fringes in a position at an integer multiple of the Talbot distance Zt from the mask 51. That is, interference fringes may be formed in such a position that n is equal to m, where m is an integer, and where the distance MD from the mask 51 is n×Zt.

Further, interference fringes may be formed in a position at a half-integer multiple of the Talbot distance Zt from the mask 51. That is, interference fringes may be formed in such a position that n is equal to m+0.5, where m is an integer, and where the distance MD from the mask 51 is n×Zt.

The Talbot distance Zt may be calculated according to the following Equation 1:

$$\text{Talbot distance } Zt = \frac{2p^2}{\lambda} \cdot \frac{1}{1+\frac{\lambda^2}{4p^2}} \quad \text{[Equation 1]}$$

where $\lambda$ is the wavelength of a pulse laser beam that is emitted from the laser light source 100 and p is the pitch of the periodic pattern 51a formed on the mask 51.

Figure 3:
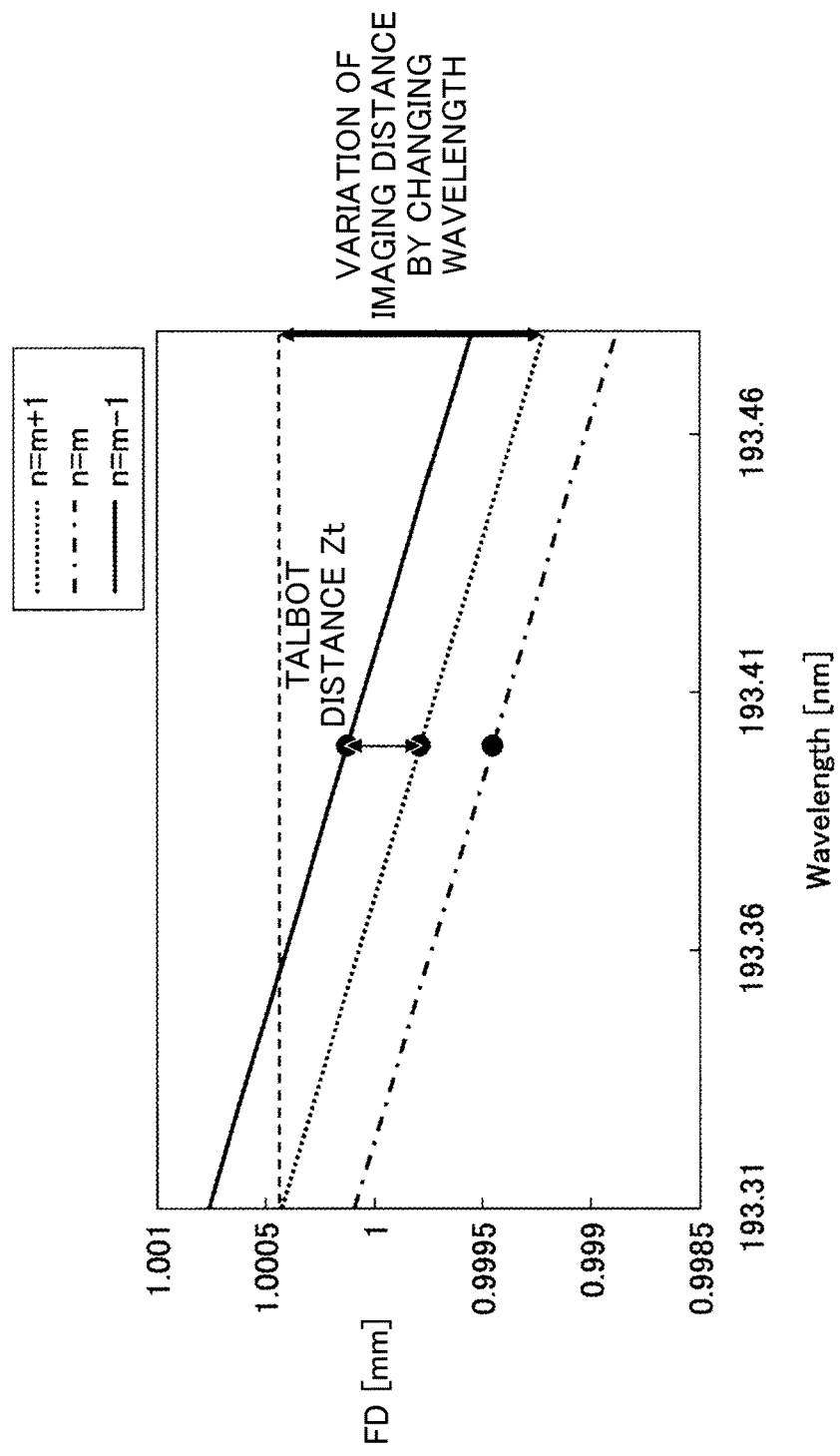
FIG. 3 is a correlation diagram between the wavelength of a pulse laser beam and the imaging distance during exposure by the Talbot effect.

With reference to FIG. 3, explanation is made for a relationship between the wavelength of a pulse laser beam that is emitted from the laser light source 100 and the imaging distance FD in a case where the wavelength of the pulse laser beam varies within a range of 193.31 nm to 193.48 nm. FIG. 3 assumes that the pitch p of the periodic pattern 51a formed on the mask 51 is 200 nm and the imaging distance FD is approximately 1 mm. In this case, the integer m, which indicates how many of these Talbot distances the imaging distance FD is equivalent to, is approximately 3000.

Assume that m is equal to n. Here, interference fringes are formed in a position at an integer multiple of the Talbot distance Zt from the mask 51. As shown in FIG. 3, as the wavelength $\lambda$ of the pulse laser beam varies within the range of 193.31 nm to 193.48 nm, the imaging distance FD can be varied from approximately 1.0004 mm to approximately 0.9993 mm by approximately 0.001 mm (1 µm). The Talbot distance Zt is approximately 0.0003 mm (300 nm). Therefore, amount of change in the imaging distance FD is greater than the Talbot distance Zt. Therefore, an image can be formed at a desired imaging distance by varying the wavelength of the pulse laser beam within the aforementioned range of wavelengths of 193.31 nm to 193.48 nm.

Next, an explanation is made for the distance D from the mask 51 required to vary the imaging distance FD by the Talbot distance Zt when the wavelength is varied within the predetermined range of wavelengths. As indicated by Equation 1, the Talbot distance Zt may depend on the value of the pitch p. A relationship between the distance D required to vary the imaging distance FD by the Talbot distance Zt, the Talbot distance Zt, the wavelength $\lambda$, and amount of change $\delta\lambda$ in the wavelength is represented by the following Equation 2:

$$\frac{D}{Zt} > \frac{\lambda}{\delta\lambda} \quad \text{[Equation 2]}$$

where $\lambda$ is the wavelength of the pulse laser beam and $\delta\lambda$ is the amount of change in the wavelength.

Figures 4, 5:
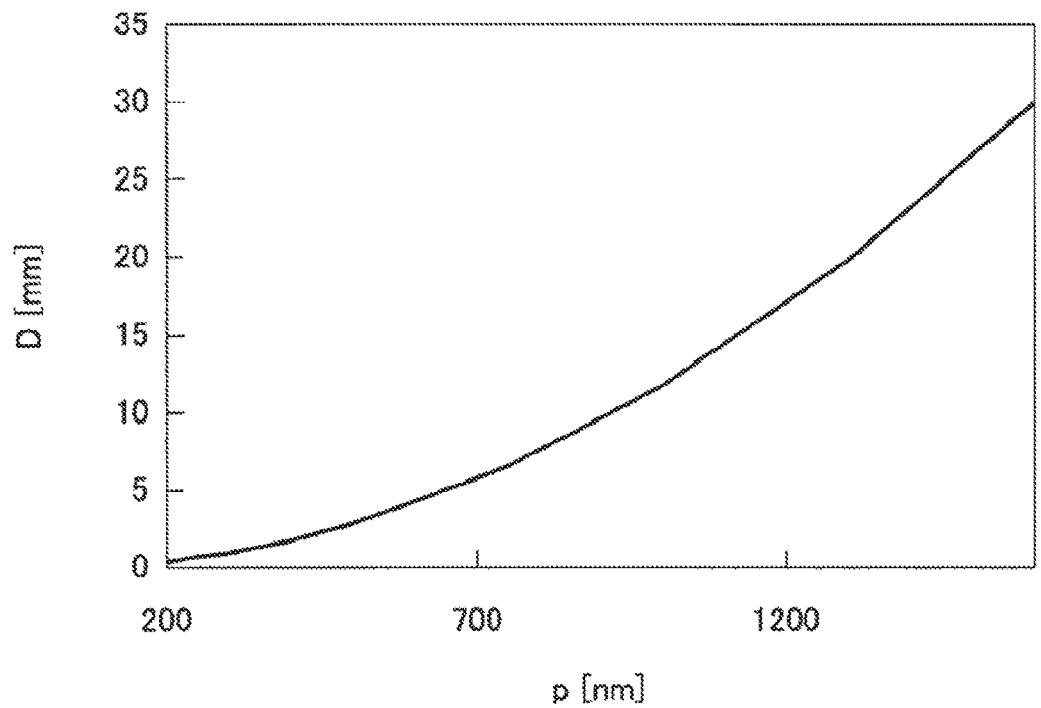
FIG. 4 is a correlation diagram between the pitch of a periodic pattern of a mask and the Talbot distance during exposure by the Talbot effect.
FIG. 5 is a first relationship diagram between the pitch of a periodic pattern of a mask and the Talbot distance during exposure by the Talbot effect.

Assume here that $\lambda$ is equal to 193.395 nm and $\delta\lambda$ is equal to 0.17 nm. Here, $\delta\lambda$ is calculated by 193.48 nm−193.31 nm. The relationship between the pitch p and the distance D is such a relationship as that shown in FIGS. 4 and 5. That is, as the pitch p becomes wider, the distance D from the mask 51 to the wafer 10 required to continuously vary the imaging distance FD by the Talbot distance Zt becomes longer.

Assume here that $Zm_t$ is the distance to the mth imaging surface by the Talbot effect as counted from the mask 51. Then, $Zm_t$ is expressed by m×Zt.

Assume that $\delta Zm_t$ is amount of change in the distance $Zm_t$ to the mth imaging surface as counted from the mask 51 in a case where the wavelength $\lambda$ of the pulse laser beam varies by $\delta\lambda$. The amount of change $\delta Zm_t$ is represented by the following Equation 3:

$$\delta Zm_t = m \frac{8p^4(4p^2+\lambda^2)}{\lambda^2(4p^2+\lambda^2)^2} \delta\lambda \quad \text{[Equation 3]}$$

If the amount of change $\delta Zm_t$ in the distance to the mth imaging surface as counted from the mask 51 in a case where the wavelength $\lambda$ varies is equal to or greater than the Talbot distance Zt, i.e., if $\delta Zm_t$ is equal to or greater than Zt, the imaging distance FD can be continuously varied simply by varying the wavelength $\lambda$ of the pulse laser beam. Therefore, from Equation 3, Equation 4 is derived to develop into Equation 5:

$$m \frac{8p^2(4p^2+\lambda^2)}{\lambda^2(4p^2+\lambda^2)^2} \delta\lambda > \frac{2p^2}{\lambda} \cdot \frac{1}{1+\frac{\lambda^2}{4p^2}} \quad \text{[Equation 4]}$$

$$m > \frac{\lambda(4p^2+\lambda^2)}{4p^2+\lambda^2} \cdot \frac{1}{|\delta\lambda|} \quad \text{[Equation 5]}$$

Figure 6:
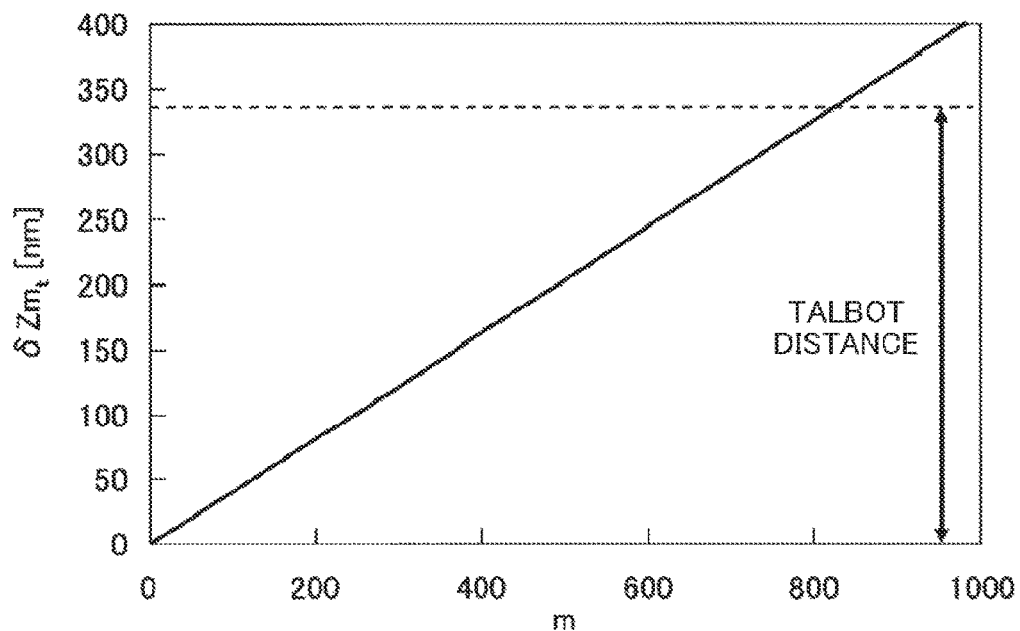
FIG. 6 is an explanatory diagram of a range within which an imaging position can be varied during exposure by the Talbot effect.
Figure 7:
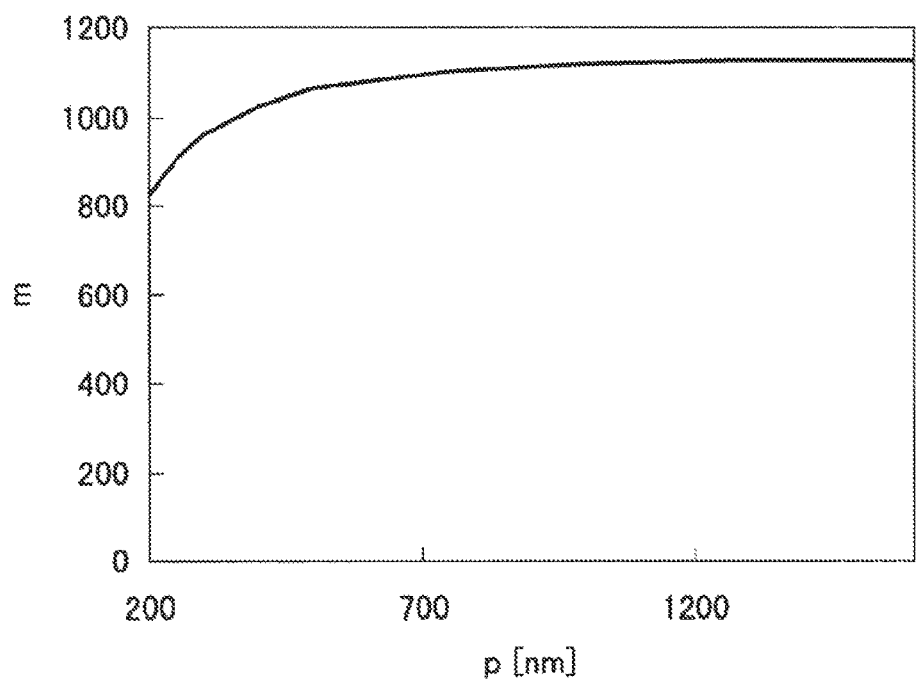
FIG. 7 is a correlation diagram between the pitch of a periodic pattern of a mask and the value of m during exposure by the Talbot effect.

Assume here that the pitch p is 200 nm, the wavelength $\lambda$ is 193.31 nm, and $\delta\lambda$ is 0.17 nm. Then, m is greater than 824.793. Therefore, if the distance from the mask 51 to the wafer 10 is the 825th Talbot distance (0.28 mm) or longer, i.e., if the distance between the mask 51 and the wafer 10 is 825 or more times longer than the Talbot distance Zt, the imaging distance FD can be continuously varied simply by adjusting the wavelength $\lambda$ of the pulse laser beam. FIG. 6 shows a relationship between the integer m shown in Equation 3 and the amount of change $\delta Zm_t$ in the distance to the mth imaging surface as counted from the mask 51. Further, FIG. 7 shows a relationship between the pitch p and the integer m.

Assume that the amount of change $\delta Zm_t$ in the distance to the mth imaging surface as counted from the mask 51 in the case where the wavelength $\lambda$ varies is less than the Talbot distance Zt. If $\delta Zm_t$ is less than Zt, the imaging distance FD may not be matched to the distance MD from the mask 51 to the wafer 10 simply by varying the wavelength $\lambda$ of the pulse laser beam. If the imaging distance FD cannot be matched to the distance MD from the mask to the wafer 10, the wafer stage 60 may be moved by a distance equal to or shorter than $\delta Zm_t$. With such a shift in the distance MD, the imaging distance FD may be matched to the distance MD by varying the wavelength $\lambda$ of the pulse laser beam. Even if the positioning accuracy of the wafer stage 60 is lower than the after-mentioned depth of focus, the imaging distance FD can be adjusted with high accuracy by varying the wavelength $\lambda$ of the pulse laser beam.

2.5.2 KrF Excimer Laser

Although the aforementioned content assumes that an ArF excimer laser is used as the laser light source 100, a KrF excimer laser may be used as the laser light source 100. In a case where a KrF excimer laser is used as the laser light source 100, a relationship between the pitch p of the periodic pattern 51a on the mask 51 and the distance D from the mask 51 to the wafer 10 required to vary the imaging distance FD by the Talbot distance Zt is different from that in the case of an ArF excimer laser. Specifically, in a case where the pitch p is 250 nm and the wavelength varies within a range of 248.185 nm to 248.535 nm, i.e., in a case where $\delta\lambda$ is 0.35 nm and the wavelength $\lambda$ is 248.36 nm, then m is greater than 508.19 according to Equation 5. Therefore, if the distance from the mask 51 to the wafer 10 is the 509th Talbot distance (0.20 m) or longer, i.e., if the distance between the mask 51 and the wafer 10 is 509 or more times longer than the Talbot distance Zt, the imaging distance FD can be continuously varied simply by adjusting the wavelength $\lambda$ of the pulse laser beam.

Assume that $\lambda$ is equal to 248.36 nm and $\delta\lambda$ is equal to 0.35 nm. Here, $\delta\lambda$ is calculated by 248.185 nm-248.535 nm. The relationship between the pitch p and the distance D is such a relationship as that shown in FIG. 8. That is, in a case where a KrF excimer laser is used as the laser light source 100, as the pitch p becomes wider, the distance D from the mask 51 to the wafer 10 required to vary the imaging distance FD by the Talbot distance Zt becomes longer, as in the case of an ArF excimer laser.

The laser light source 100 is not limited to the aforementioned ArF excimer laser or KrF excimer laser. The laser light source 100 may be an XeF excimer laser apparatus configured to emit ultraviolet light with a wavelength of 352 nm or an $F_2$ excimer laser apparatus configured to emit ultraviolet light with a wavelength of 157 nm. Alternatively, as will be described later, the laser light source 100 may be one in which a solid-state laser is used.

Figures 8, 9:
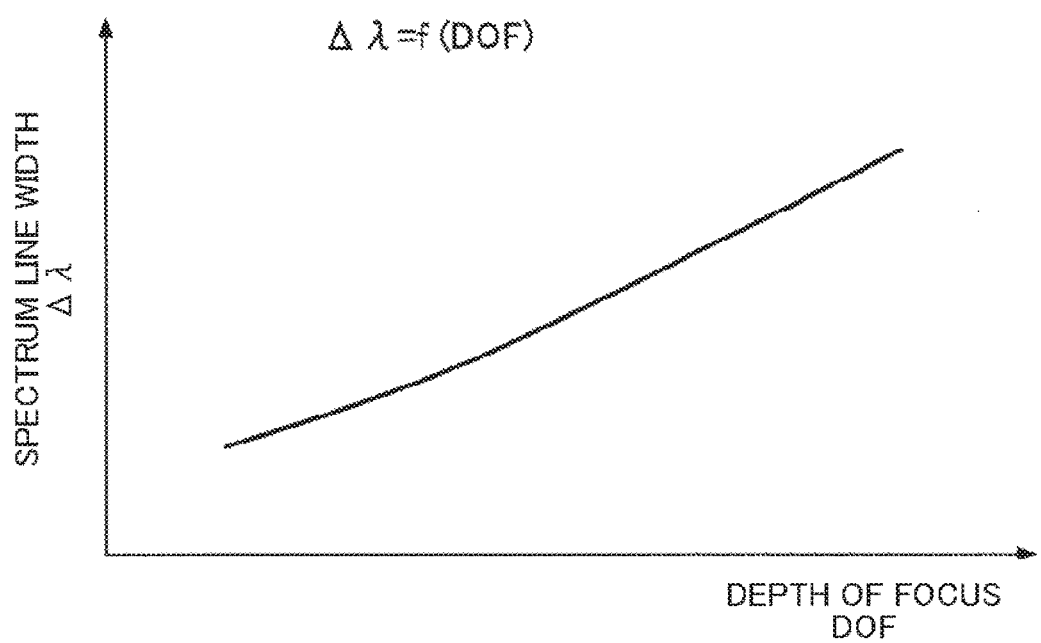
FIG. 8 is a second relationship diagram between the pitch of a periodic pattern of a mask and the Talbot distance during exposure by the Talbot effect.
FIG. 9 is a correlation diagram between the depth of focus and the spectrum line width during exposure by the Talbot effect.

2.5.3 Relationship Between the Spectrum Line Width $\Delta\lambda$ of a Pulse Laser Beam and the Depth of Focus DOF Next, a relationship between the spectrum line width $\Delta\lambda$ of a pulse laser beam that is emitted from the laser light source 100 and the depth of focus DOF is described. Since, as mentioned above, the imaging distance FD can be varied by varying the wavelength $\lambda$ of the pulse laser beam, the depth of focus (DOF) can be deepened if the spectrum line width $\Delta\lambda$ is wide. Specifically, as shown in FIG. 9, the depth of focus (DOF) can be deepened by widening the spectrum line width $\Delta\lambda$.

For this purpose, an approximate expression or numeric data indicating the relationship between the depth of focus DOF and the spectrum line width $\Delta\lambda$ may be stored in a memory unit (not illustrated) of the controller 70. The controller 70 may calculate a target spectrum line width $\Delta\lambda t$ according to the approximate expression or numeric data, stored in the memory unit (not illustrated), which indicates the relationship between the depth of focus DOF and the spectrum line width $\Delta\lambda$ and send the target spectrum line width $\Delta\lambda t$ to the laser light source 100. The laser light source 100 may adjust the pulse laser beam that is emitted, in order that the target spectrum line width $\Delta\lambda t$ can be achieved.

2.5.4 Direction of Polarization of a Pulse Laser Beam

Figure 10:
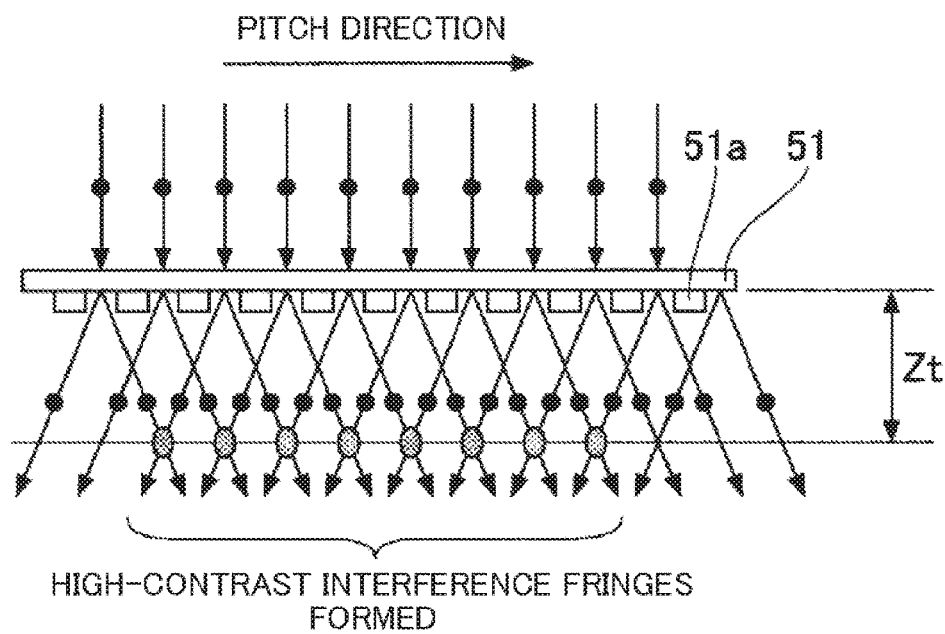
FIG. 10 is a first explanatory diagram of a direction of polarization of a pulse laser beam during exposure by the Talbot effect.
Figure 11:
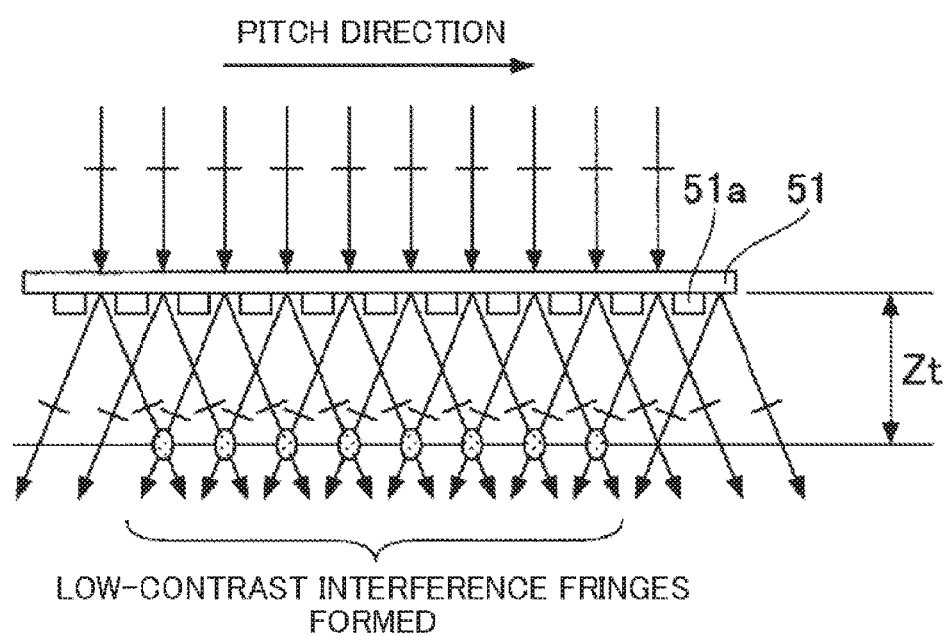
FIG. 11 is a second explanatory diagram of a direction of polarization of a pulse laser beam during exposure by the Talbot effect.

Next, a relationship between the direction of polarization of a pulse laser beam that is emitted from the laser light source 100 and the array direction of the periodic pattern 51a on the mask 51 is described with reference to FIGS. 10 and 11. As shown in FIGS. 10 and 11, each of the lines or spaces constituting the periodic pattern 51a of the mask 51 may extend perpendicularly to the paper plane, and the array direction of the periodic pattern 51a may be parallel to the paper plane. A pulse laser beam that is incident on the mask 51 may be linearly polarized light.

FIG. 10 shows a case where the direction of polarization of a pulse laser beam that is incident on the mask 51 is perpendicular to the paper plane, i.e., a case where the direction that each of the lines or spaces constituting the periodic pattern 51a on the mask 51 extends and the direction of polarization of the pulse laser beam are parallel to each other. In other words, FIG. 10 shows a case where the array direction (pitch direction) of the periodic pattern 51a on the mask 51 and the direction of polarization of the pulse laser beam are perpendicular to each other. In this case, the pulse laser beam, which is linearly polarized light whose direction of polarization is perpendicular to the array direction of the periodic pattern 51a on the mask 51, is highly coherent, so that high-contrast interference fringes may be formed at the Talbot distance Zt.

FIG. 11 shows a case where the direction of polarization of a pulse laser beam that is incident on the mask 51 is parallel to the paper plane, i.e., a case where the direction that each of the lines or spaces constituting the periodic pattern 51a on the mask 51 extends and the direction of polarization of the pulse laser beam are perpendicular to each other. In other words, FIG. 11 shows a case where the array direction (pitch direction) of the periodic pattern 51a on the mask 51 and the direction of polarization of the pulse laser beam are parallel to each other. In this case, the pulse laser beam, which is linearly polarized light whose direction of polarization is parallel to the array direction of the periodic pattern 51a on the mask 51, is lowly coherent, so that low-contrast interference fringes may be formed at the Talbot distance Zt.

For these reasons, it is preferable that a pulse laser beam be incident on the mask 51 so that the direction of polarization of the pulse laser beam is substantially perpendicular to the direction that each of the lines or spaces constituting the periodic pattern 51a on the mask 51 extends. This allows high-contrast interference fringes to be formed.

Figure 12:
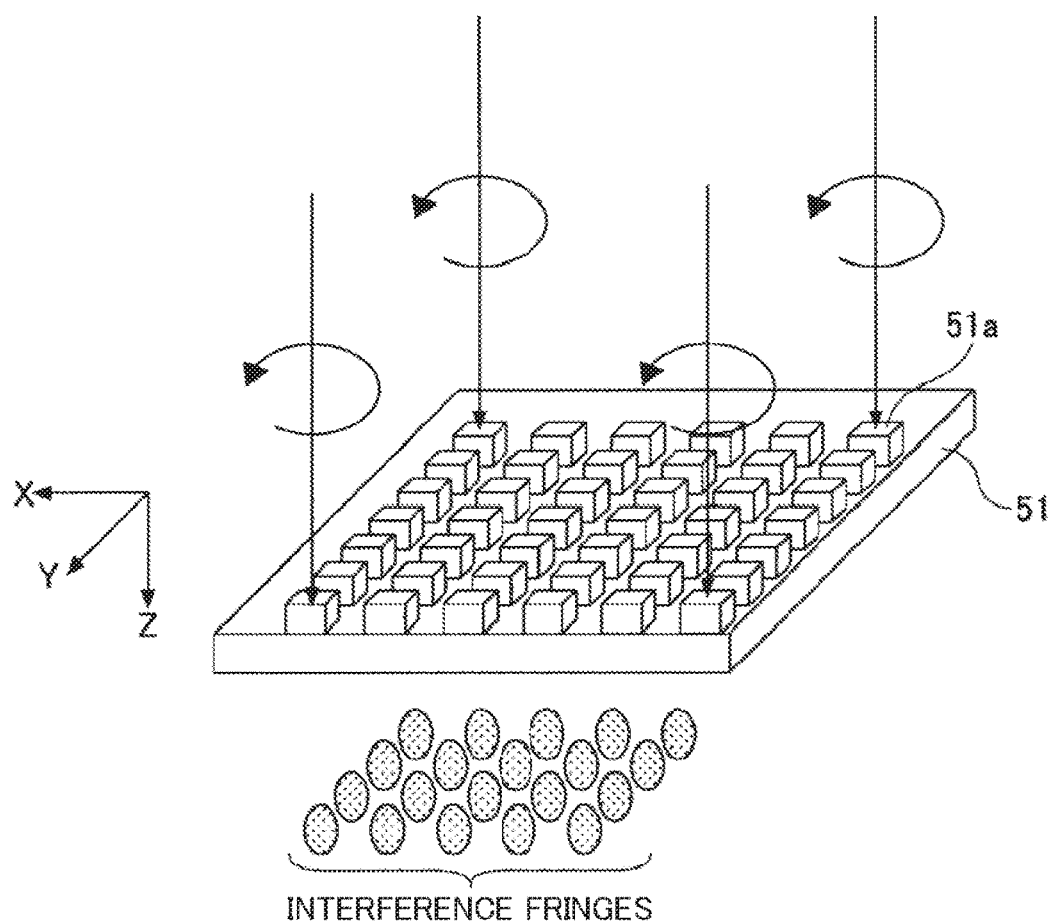
FIG. 12 is a third explanatory diagram of a direction of polarization of a pulse laser beam during exposure by the Talbot effect.

Alternatively, in a case where the periodic pattern 51a has a two-dimensional array of quadrangular or circular shapes on the mask 51, two-dimensionally periodic interference fringes, such as those shown in FIG. 12, may be formed by causing a circularly polarized pulse laser beam to be incident on the mask 51.

3. Laser Light Source

Next, the laser light source 100 is described with reference to FIG. 13.

3.1 Configuration

The laser light source 100 may include a partial reflection mirror 115, a wavefront control unit 121, a wavelength-variable module 114, a laser chamber 110, a first beam splitter 116, a polarization control unit 122, an energy monitor 117, a spectroscope 118, an exit aperture shutter 119, a power supply 113, a wavelength controller 140, and a laser controller 130.

A laser resonator may be constituted by the partial reflection mirror 115 and the wavelength-variable module 114.

The wavelength-variable module 114 may include a first prism 114a, a second prism 114b, a grating 114c, and a rotating stage 114d. The first prism 114a and the second prism 114b may be disposed so that a beam of pulse laser light emitted from the laser chamber 110 is expanded. Mounting of the grating 114c may be Littrow arrangement, in which the angle of incidence and the angle of diffraction are equal.

The second prism 114b may be placed on the rotating stage 114d. The angle of incidence, which is equal to the angle of diffraction, of a pulse laser beam that is incident on the grating 114c may be varied by rotating the second prism 114b by the rotating stage 114d.

On those surfaces of the first and second prisms 114a and 114b through which a pulse laser beam enters and exits, films configured to highly transmit P-polarized light and highly reflect S-polarized light may be formed.

The laser chamber 110 may be placed on the optical path of the laser resonator. The laser chamber 110 may include windows 110a and 110b and a pair of discharge electrodes 111a and 111b. The windows 110a and 110b may be disposed at a Brewster's angle. The laser chamber 110 may be filled with an ArF laser gas that serves as a laser gain medium. The power supply 113 may be provided with a switch 113a configured to perform control to apply a pulsed high voltage between the discharge electrodes 111a and 111b.

The wavefront control unit 121 may be placed on the optical path of the laser resonator. The wavefront control unit 121 may include a cylindrical concave lens 121a, a cylindrical convex lens 121b, and a single-axle stage 121c configured to move the cylindrical concave lens 121a.

The first beam splitter 116 may be placed on the optical path of a pulse laser beam emitted from the partial reflection mirror 115. The first beam splitter 116 may separate an incident pulse laser beam into reflected light and transmitted light. The energy monitor 117 and the spectroscope 118 may be placed in positions on which the reflected light from the first beam splitter 116 is incident. The first beam splitter 116 may have on a surface thereof a film configured to make P-polarized light and S-polarized light substantially equal in reflectance to each other.

The polarization control unit 122 may be placed in a position on which the transmitted light from the first beam splitter 116 is incident. The polarization control unit 122 may include a half-wavelength plate 122a, a quarter-wavelength plate 122b, a rotating stage 122c, and a rotating stage 122d. The half-wavelength plate 122a and the quarter-wavelength plate 122b may be formed by $MgF_2$ crystals.

The half-wavelength plate 122a, placed on the rotating stage 122c, may be rotated by the rotating stage 122c on the optical path axis of a pulse laser beam. The quarter-wavelength plate 122b, placed on the rotating stage 122d, may be rotated by the rotating stage 122d on the optical path axis of a pulse laser beam. The half-wavelength plate 122a and the quarter-wavelength plate 122b may be rotated so that the angles between the optical axes of the half-wavelength plate 122a and the quarter-wavelength plate 122b and the direction of polarization of a pulse laser beam emitted are predetermined angles, respectively. The exit aperture shutter 119 may be provided on the optical path of a pulse laser beam emitted from the polarization control unit 122.

The energy monitor 117 may include a second beam splitter 117a and a pulse energy sensor 117b. The second beam splitter 117a may have on a surface thereof a film configured to make P-polarized light and S-polarized light substantially equal in reflectance to each other.

The reflected light from the first beam splitter 116 may be incident on the second beam splitter 117a to be separated by the second beam splitter 117a into reflected light and transmitted light. The reflected light from the second beam splitter 117a may enter the pulse energy sensor 117b. Further, the transmitted light from the second beam splitter 117a may enter the spectroscope 118.

The spectroscope 118 may include a diffusion element 118a such as a diffuser, an etalon 118b, a collector lens 118c, and a line sensor 118d. The diffusion element 118a, the etalon 118b, the collector lens 118c, and the line sensor 118d, disposed in this order, may be disposed so that the line sensor 118d is located on a focal plane of the collector lens 118c.

3.2 Operation

The laser controller 130 may receive information on target optical parameters of a pulse laser beam from the controller 70 of the exposure unit. The target optical parameters may for example include the target wavelength $\lambda t$, the target spectrum line width $\Delta\lambda t$, the target polarization plane angle $\theta t$, and the target phase difference $\phi t$.

The laser controller 130 may output an exposure stop signal to the controller 70 and close the exit aperture shutter 119.

The laser controller 130 may send the target wavelength $\lambda t$ and the target spectrum line width $\Delta\lambda t$ to the wavelength controller 140.

The power supply 113 may be controlled by the laser controller 130 to apply a pulsed high voltage between the discharge electrodes 111a and 111b at a predetermined applied voltage and a predetermined repetition frequency, so that discharge of electricity occurs in the laser chamber 110.

The discharge of electricity between the discharge electrodes 111a and 111b in the laser chamber 110 causes the ArF laser gas to be excited so that laser oscillation may be performed in the laser resonator constituted by the partial reflection mirror 115 and the wavelength-variable module 114. A pulse laser beam generated by the laser oscillation may be emitted from the partial reflection mirror 115. For example, a pulse laser beam whose direction of polarization is parallel to the paper plane may be emitted from the partial reflection mirror 115.

A part of the pulse laser beam emitted from the partial reflection mirror 115 may be reflected by the first beam splitter 116 to enter the energy monitor 117. A part of the pulse laser beam having entered the energy monitor 117 may be reflected by the second beam splitter 117a of the energy monitor 117 to enter the pulse energy sensor 117b. The pulse energy sensor 117b may measure the pulse energy of the incoming pulse laser beam, and information on the pulse energy measured by the pulse energy sensor 117b may be sent to the laser controller 130.

The light transmitted through the second beam splitter 117a may enter the spectroscope 118. The pulse laser beam having entered the spectroscope 118 may enter the etalon 118b after being diffused by the diffusion element 118a.

The pulse laser beam having entered the etalon 118b may form interference fringes on a measuring surface of the line sensor 118d after being transmitted through the etalon 118b and collected by the collector lens 118c. The interference fringes thus formed may be measured by the line sensor 118d, and information thus measured by the line sensor 118d may be sent to the wavelength controller 140.

The wavelength controller 140 may calculate the oscillation wavelength $\lambda$ of the pulse laser beam from the diameters of the interference fringes measured by the line sensor 118d and calculate the spectrum line width $\Delta\lambda$ from the widths of the interference fringes. The wavelength controller 140 may calculate difference $\delta\lambda$ between the target wavelength $\lambda t$ and the oscillation wavelength $\lambda$ and difference $\delta\Delta\lambda$ between the target spectrum line width $\Delta\lambda t$ and the measured spectrum line width $\Delta\lambda$. The difference $\delta\lambda$ may be calculated by $\lambda - \lambda t$. The difference $\delta\Delta\lambda$ may be calculated by $\Delta\lambda - \Delta\lambda t$.

The wavelength controller 140 may send a signal to the rotating stage 114d so that the oscillation wavelength of the pulse laser beam shifts by δλ. The angle of incidence, which is equal to the angle of diffraction, of the pulse laser beam on the grating 114c may be varied by rotating the second prism 114b by the rotating stage 114d. This may vary the oscillation wavelength of the pulse laser beam.

The wavelength controller 140 may send a signal to the single-axle stage 121c so that the spectrum line width of the pulse laser beam varies by δΔλ. The wavelength controller 140 may move the cylindrical concave lens 121a by the single-axle stage 121c to adjust the distance between the cylindrical concave lens 121a and the cylindrical convex lens 121b. This varies the wavefront of the pulse laser beam that is incident on the grating 114c in the wavelength-variable module 114. This may therefore vary the spectrum line width of the pulse laser beam. This allows the oscillation wavelength λ of the pulse laser beam to be closer to the target wavelength λt and the spectrum line width Δλ of the pulse laser beam to be closer to the target spectrum line width Δλt.

The wavelength controller 140 may send information on |δλ| and |δΔλ| to the laser controller 130.

The laser controller 130 may send control signals to the rotating stages 122c and 122d, respectively, so that a laser beam of linearly polarized light substantially parallel to the paper plane may be converted into a laser beam having the target polarization parameters (i.e. the target polarization plane angle θt and the target phase difference φt).

If the laser controller 130 determines that |δλ| and |δΔλ| are within tolerable limits, the laser controller 130 may stop the laser oscillation, send an exposure start signal to the controller 70, and send a signal to the exit aperture shutter 119 to open the exit aperture shutter 119.

The controller 70 of the exposure apparatus may send target pulse energy and a light-emitting trigger to the laser controller 130, and may thereby cause laser oscillation to be performed.

Thus, a pulse laser beam having the target wavelength λt, the target spectrum line width Δλt, and the target polarization parameters (i.e. the target polarization plane angle θt and the target phase difference φt) may enter the exposure apparatus.

3.3 Working Effects

Since the spectroscope 118 is used to detect the oscillation wavelength λ of the pulse laser beam oscillated and control the angle of rotation of the second prism 114b in the wavelength-variable module 114, feedback control can be performed on the wavelength of the pulse laser beam to be outputted to the target wavelength. Further, since the spectroscope 118 is used to detect the spectrum line width Δλ of the pulse laser beam oscillated and control the wavefront control unit 121, feedback control can be performed on the spectrum line width of the pulse laser beam to be outputted to the target spectrum line width.

Further, by controlling the angles of rotation of the half-wavelength plate 122a and the quarter-wavelength plate 122b in the polarization control unit 122, the pulse laser beam may be converted to have the target polarization plane angle θt and the target phase difference φt.

3.4 Others

In the foregoing, the wavelength λ of a pulse laser beam is varied by rotating the second prism 114b in the wavelength-variable module 114. Alternatively, the wavelength of a pulse laser beam may be varied by rotating the first prism 114a or the grating 114c.

Further, in the foregoing, the spectrum line width Δλ of a pulse laser beam is varied by providing the wavefront control unit 121 in the laser resonator. Alternatively, the first and second prisms 114a and 114b of the wavelength-variable module 114 may be used as prism beam expanders to control the scale factor.

Further, in the foregoing, the half-wavelength plate 112a and the quarter-wavelength plate 122b are used as elements in the polarization control unit 122 to control polarization. Alternatively, a reflective half-wavelength phase shift retarder and a reflective quarter-wavelength phase shift retarder may be used.

Further, in a case where the periodic pattern 51a of the mask 51 is only of lines and spaces, only the half-wavelength plate 122a may be placed to control only the direction of polarization of linearly polarized light.

Further, the polarization control unit 122 may be placed anywhere on an optical path between the partial reflection mirror 115 and the mask 51. In a case where the polarization control unit 122 is placed in the exposure unit including the optical path tube 20, the optical system 40, and the like, the polarization control unit 122 may be controlled by the controller 70.

Figure 14:
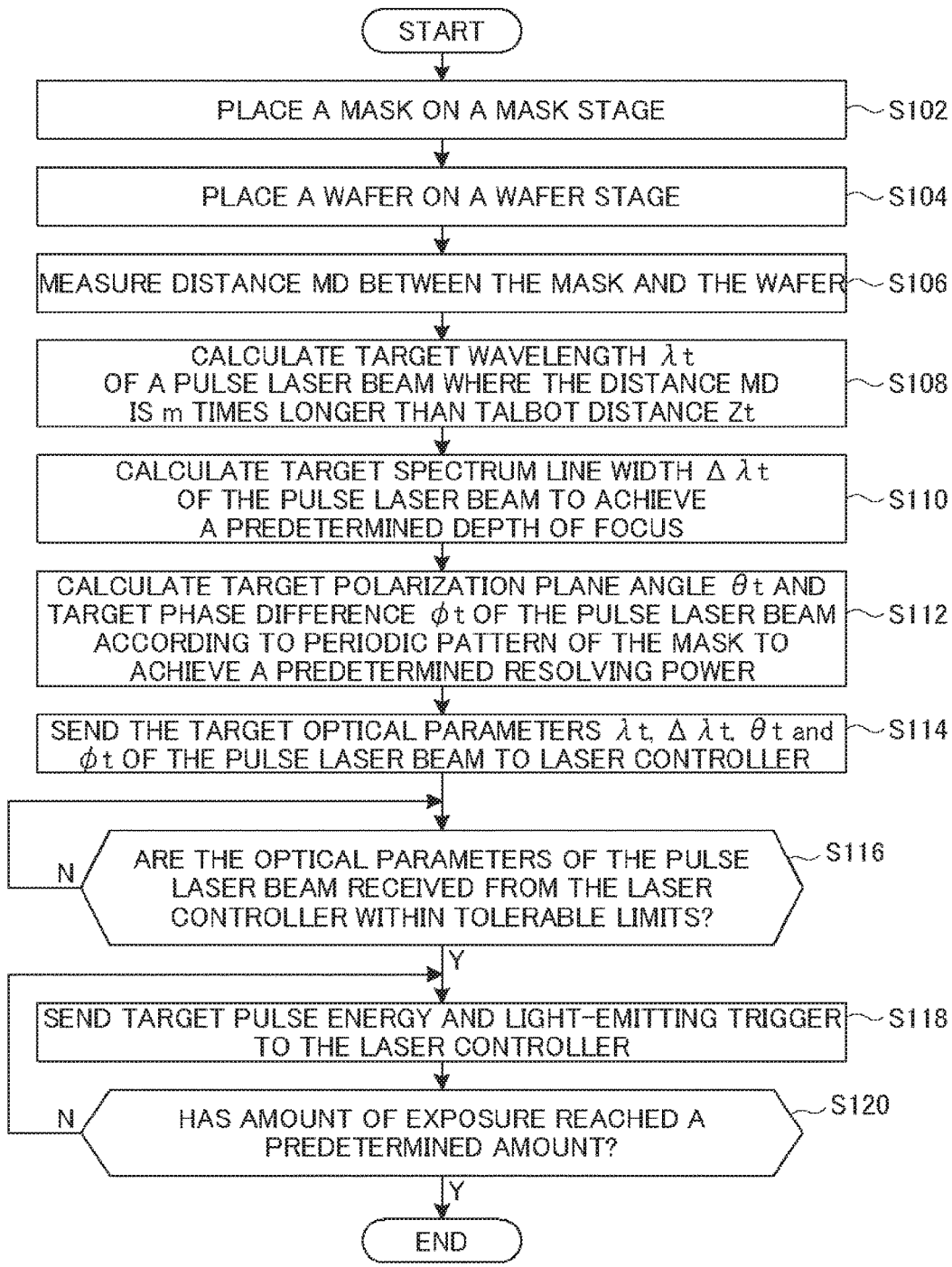
FIG. 14 is a flow chart of a first method for controlling the laser light source in the exposure apparatus according to the present disclosure.

4. Control of the Laser Light Source 4.1 A First Method for Controlling the Laser Light Source Next, a first method for controlling the laser light source in the exposure apparatus according to the present disclosure is described with reference to FIG. 14. FIG. 14 mainly shows control in the controller 70.

First, in step 102 (S102), the mask 51 may be placed on the mask stage 50.

Next, in step 104 (S104), the wafer 10 may be placed on the wafer stage 60.

Next, in step 106 (S106), the distance MD between the mask 51 and the wafer 10 may be measured by the distance sensor 52. After that, information on the distance MD measured by the distance sensor 52 may be sent to the controller 70.

Next, in step 108 (S108), the controller 70 may calculate the target wavelength λt of a pulse laser beam that is emitted from the laser light source 100, in order that the distance MD is m times longer than the Talbot distance Zt.

Next, in step 110 (S110), the controller 70 may calculate the target spectrum line width Δλt of the pulse laser beam that is emitted from the laser light source 100, in order that a predetermined depth of focus can be achieved in the surface of the wafer 10.

Next, in step 112 (S112), the controller 70 may calculate the target polarization plane angle θt and target phase difference φt of the pulse laser beam according to the periodic pattern 51a on the mask 51 so that a predetermined resolving power can be achieved.

Next, in step 114 (S114), the controller 70 may send, to the laser controller 130, the target optical parameters of the pulse laser beam that is emitted from the laser light source 100. The target optical parameters may include the target wavelength λt, target spectrum line width Δλt, target polarization plane angle θt, and target phase difference φt of the pulse laser beam.

Next, in step 116 (S116), the controller 70 may determine whether the optical parameters received from the laser controller 130, including the wavelength and the spectrum line width, are within tolerable limits. If the optical parameters are within the tolerable limits, the controller 70 may proceed to step 118. On the other hand, if the optical parameters are not within the tolerable limits, the controller 70 may repeat step 116.

In step 118 (S118), the controller 70 may send the target pulse energy and the light-emitting trigger to the laser controller 130.

Next, in step 120 (S120), the controller 70 may determine whether an amount of exposure has reached a predetermined amount of exposure. If the amount of exposure has not reached the predetermined amount of exposure, the controller 70 may proceed to step 118. If the amount of exposure has reached the predetermined amount of exposure, this control method may be ended by ending the exposure. The amount of exposure may be measured by an exposure amount sensor (not illustrated) placed near the wafer 10.

4.2 A Second Method for Controlling the Laser Light Source

Next, a second method for controlling the laser light source in the exposure apparatus according to the present disclosure is described. In this embodiment, pulse laser beams of wavelengths $\lambda 1$ and $\lambda 2$ may be used to expose a pattern with half the pitch p of the periodic pattern 51a on the mask 51.

Figure 15:
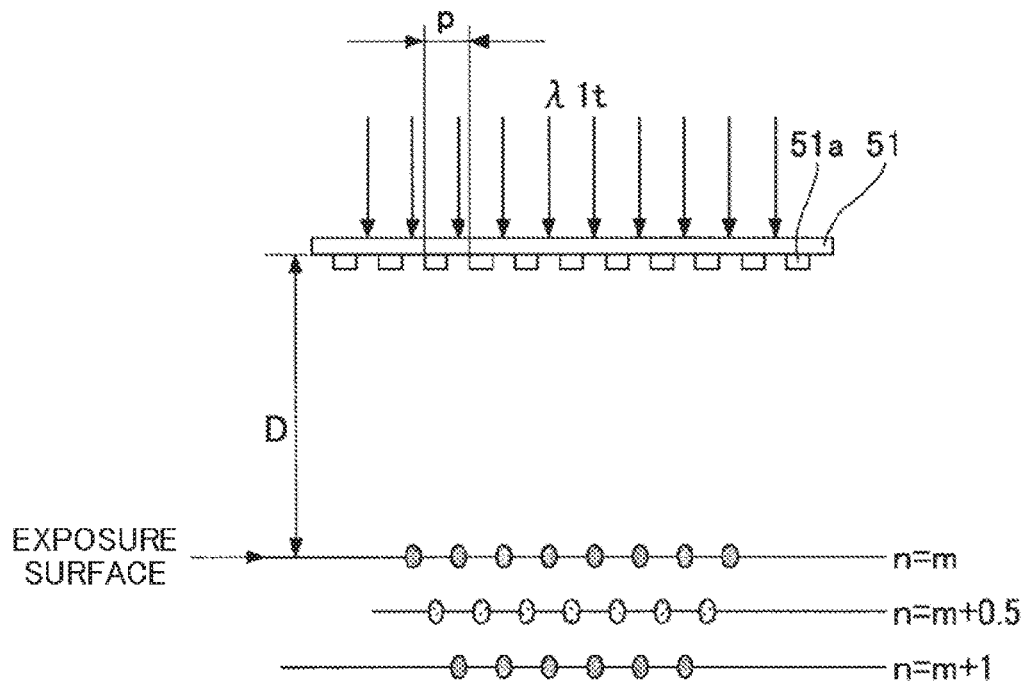
FIG. 15 is a first explanatory diagram of a second method for controlling the laser light source in the exposure apparatus according to the present disclosure.

First, the controller 70 may calculate a first target wavelength $\lambda 1t$ so that, as shown in FIG. 15, the distance MD from the mask 51 to an exposure surface of the wafer 10 is m times longer than the Talbot distance Zt, and may perform exposure with a pulse laser beam of this wavelength.

Figure 16:
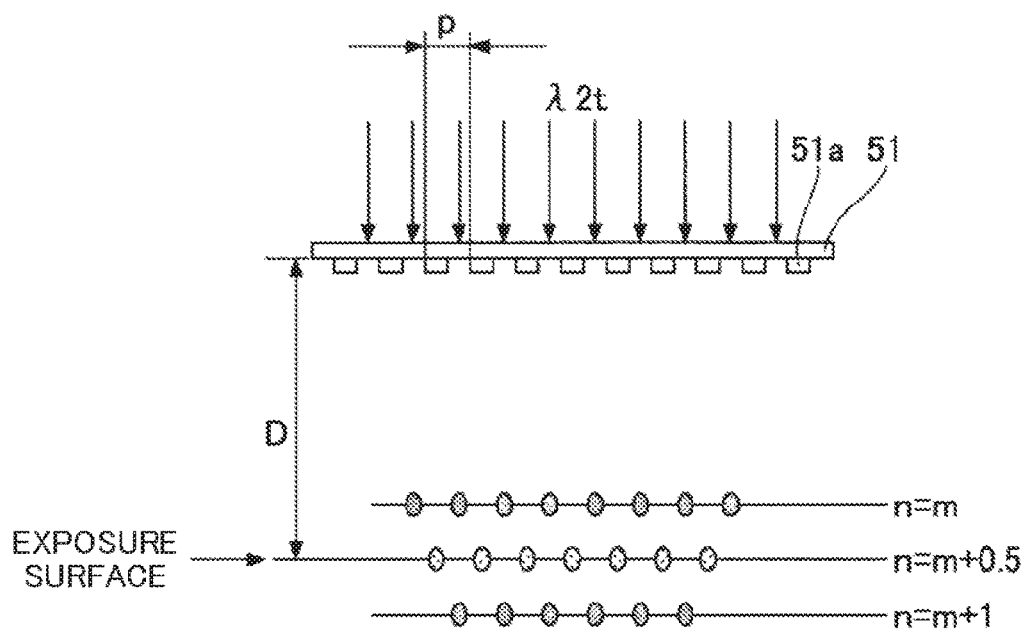
FIG. 16 is a second explanatory diagram of the second method for controlling the laser light source in the exposure apparatus according to the present disclosure.

Next, the controller 70 may calculate a second target wavelength $\lambda 2t$ so that, as shown in FIG. 16, the distance MD from the mask 51 to the exposure surface of the wafer 10 is (m+0.5) times longer than the Talbot distance Zt, and may perform exposure with a pulse laser beam of this wavelength.

By thus performing exposure twice, a pattern with a half pitch p/2 which corresponds to a half of the pitch p of the periodic pattern 51a on the mask 51 can be exposed.

Figure 17:
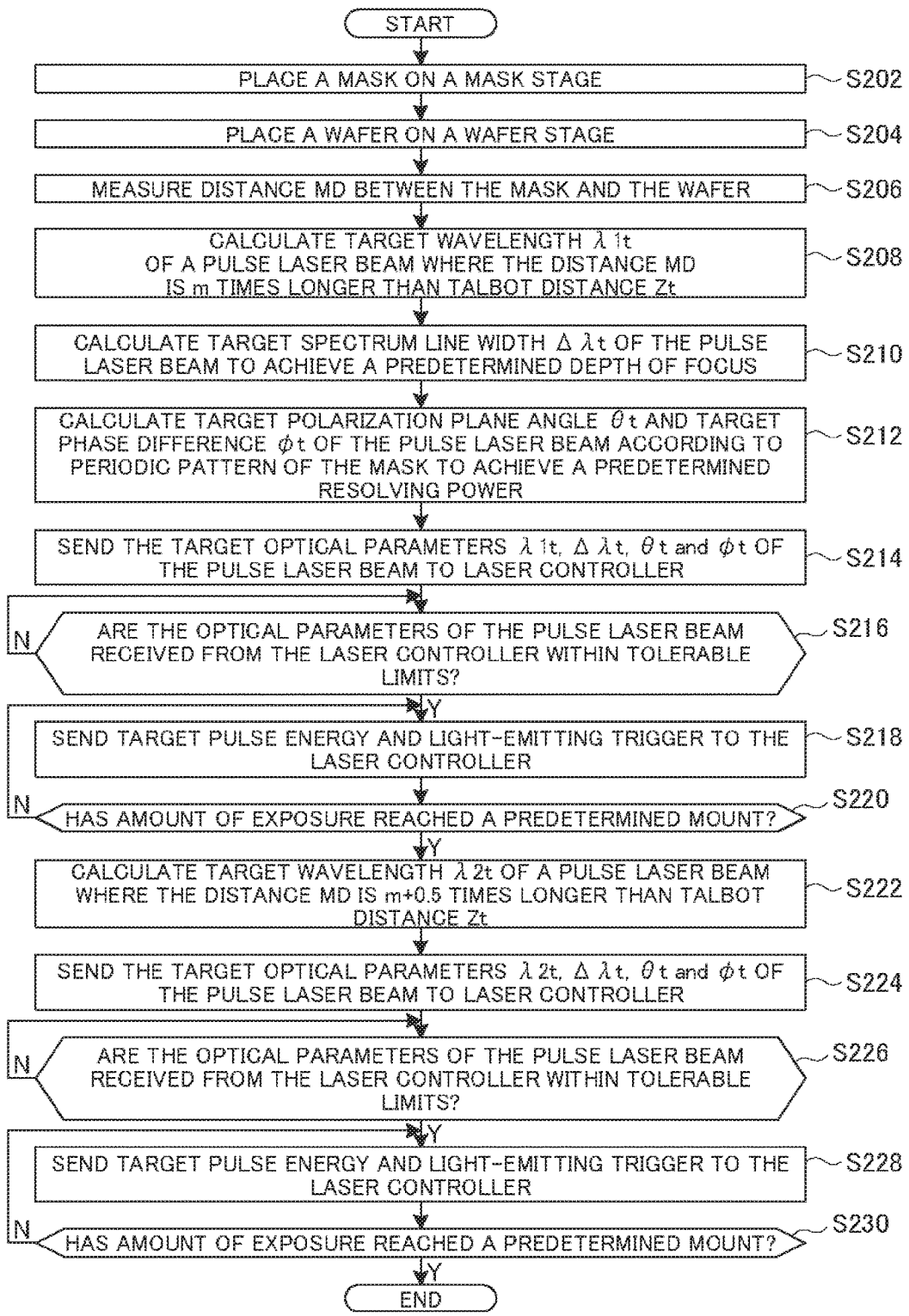
FIG. 17 is a flow chart of the second method for controlling the laser light source in the exposure apparatus according to the present disclosure.

Next, a method for controlling the laser light source in the aforementioned exposure method is described with reference to FIG. 17. FIG. 17 mainly shows control in the controller 70.

The process from step 202 (S202) to step 220 (S220) shown in FIG. 17 may be substantially the same as the process from step 102 (S102) to step 120 (S120) described with reference to FIG. 14, respectively.

However, in step 208 (S208), instead of the target wavelength $\lambda t$ (see FIG. 14), a first target wavelength $\lambda 1t$ may be calculated so that the distance MD is m times longer than the Talbot distance Zt. Further, in step 214 (S214), instead of the target wavelength $\lambda t$ (see FIG. 14), the first target wavelength $\lambda 1t$ may be sent to the laser controller 130. If, in step 220 (S220), the amount of exposure has reached the predetermined amount of exposure, the controller 70 may proceed to step 222.

The process from step 222 (S222) to step 230 (S230) shown in FIG. 17 may be substantially the same as the process of step 108 (S108) and from step 114 (S114) to step 120 (S120) described with reference to FIG. 14, respectively.

However, in step 222 (S222), instead of the target wavelength $\lambda t$ (see FIG. 14), a second target wavelength $\lambda 2t$ may be calculated so that the distance MD is (m+0.5) times longer than the Talbot distance Zt. Further, in step 224 (S224), instead of the target wavelength $\lambda t$ (see FIG. 14), the second target wavelength $\lambda 2t$ may be sent to the laser controller 130.

4.3 A Third Method for Controlling the Laser Light Source

Figure 18:
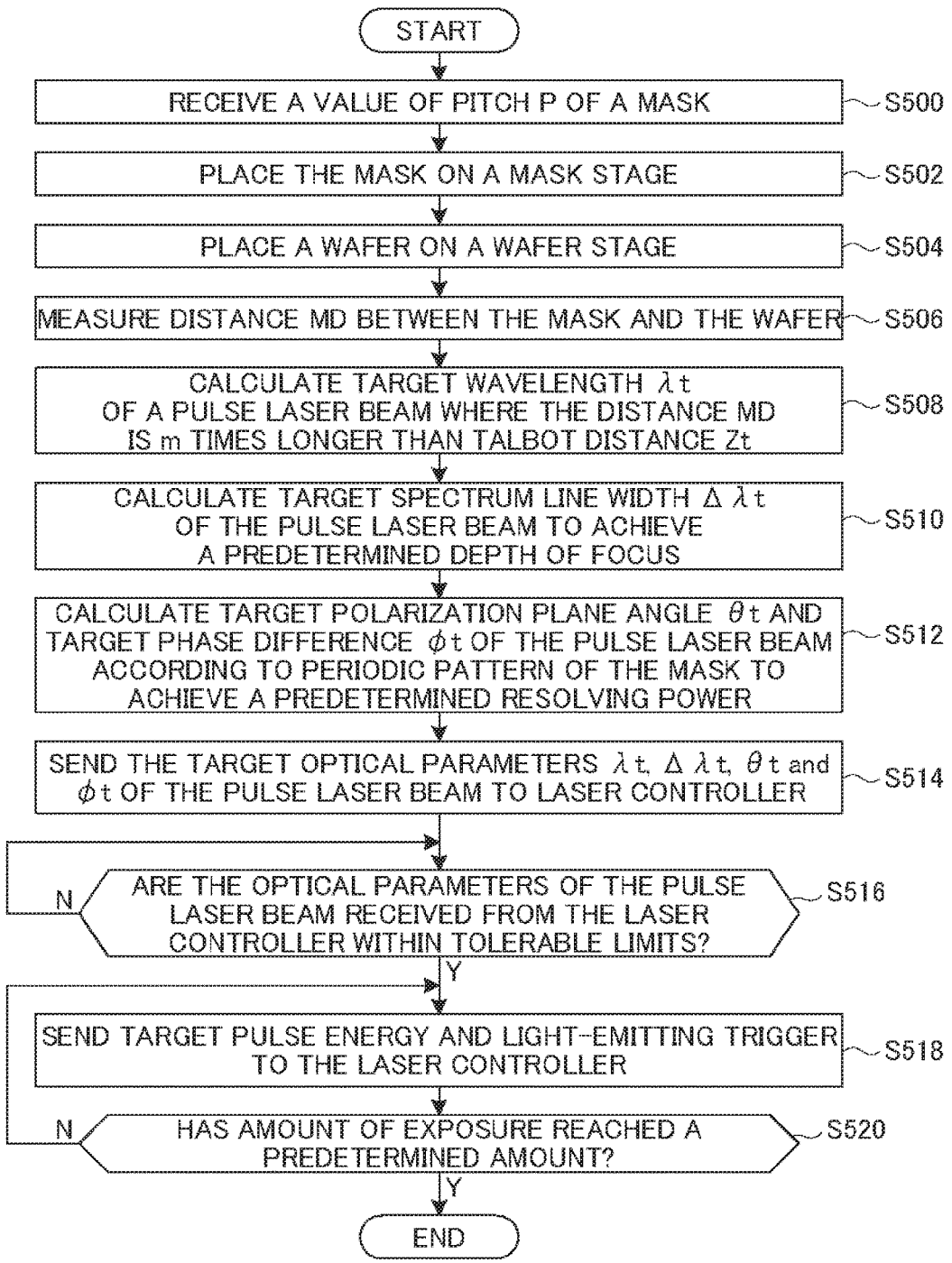
FIG. 18 is a flow chart of a third method for controlling the laser light source in the exposure apparatus according to the present disclosure.

Next, a third method for controlling the laser light source in the exposure apparatus according to the present disclosure is described with reference to FIG. 18. In this embodiment, a step of receiving the value of the pitch p of the mask may be added. FIG. 18 mainly shows control in the controller 70.

First, in step 500 (S500), the controller 70 may receive the value of the pitch p of the periodic pattern 51a on the mask 51.

For example, in a case where a bar code (not illustrated) containing information on the pitch p is printed on the mask 51, the value of the pitch p may be received by reading the bar code with a bar code reader (not illustrated).

Alternatively, in a case where a bar code containing information identifying the mask 51 is printed on the mask 51, the bar code may be read. After the mask 51 has been identified, information on the pitch p corresponding to the mask 51 may be searched for through a database (not illustrated), and the information thus found may be received.

Alternatively, information on the pitch p that is inputted by an operator with a keyboard or the like (not illustrated) may be accepted by the controller 70.

The subsequent process from step 502 (S502) to step 520 (S520) may be substantially the same as the process from step 102 (S102) to step 120 (S120) described with reference to FIG. 14, respectively. However, in step 508 (S508), the target wavelength $\lambda t$ may be calculated from the value of the pitch p received in step 500 (S500) and the distance MD measured in step 506 (S506).

4.4 A Fourth Method for Controlling the Laser Light Source

Figure 19:
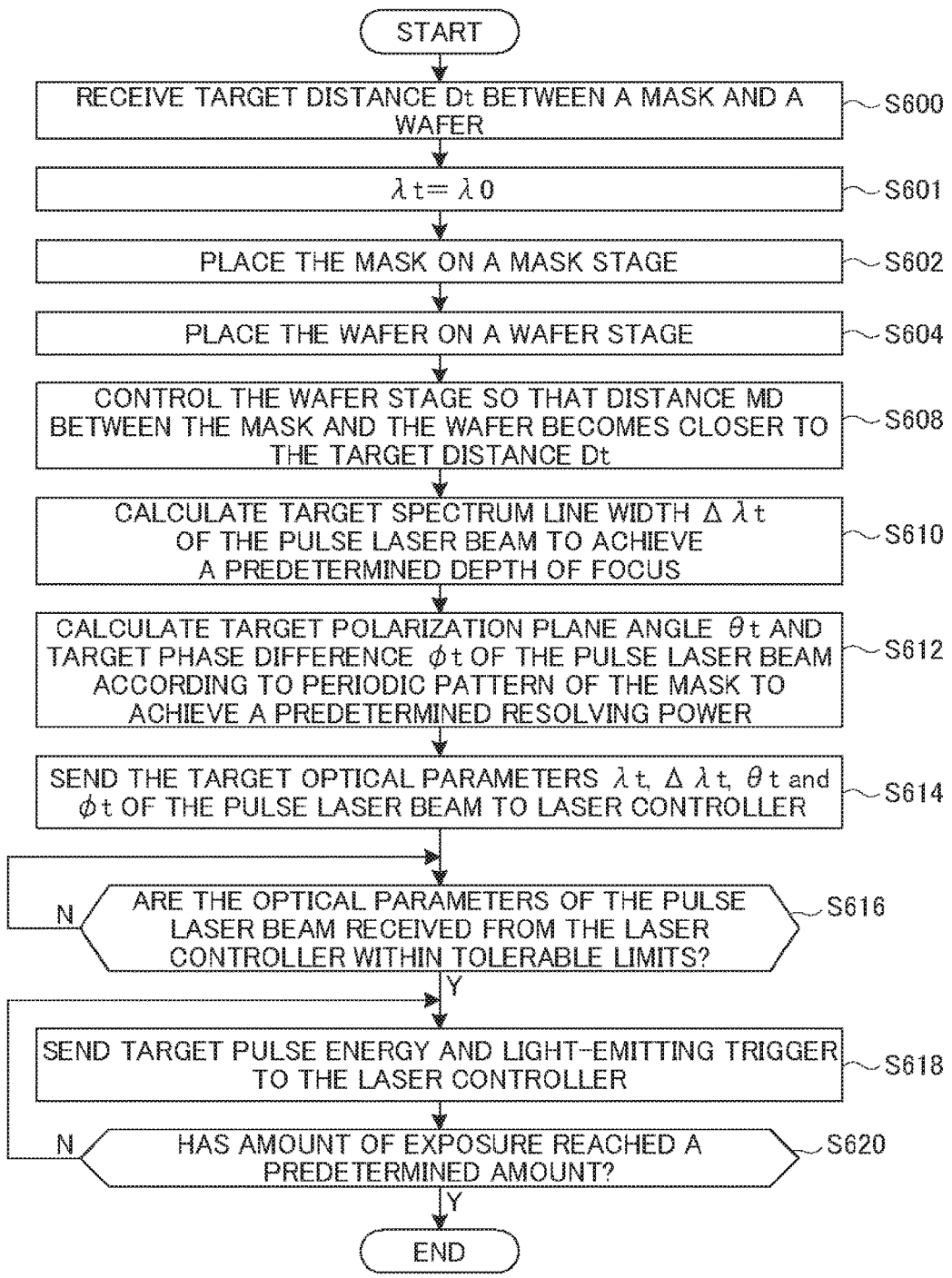
FIG. 19 is a flow chart of a fourth method for controlling the laser light source in the exposure apparatus according to the present disclosure.

Next, a fourth method for controlling the laser light source in the exposure apparatus according to the present disclosure is described with reference to FIG. 19. In this embodiment, a target distance Dt from the mask 51 to the wafer 10 may be set, and the wafer stage 60 may be controlled in accordance with the target distance Dt. FIG. 19 mainly shows control in the controller 70.

First, in step 600 (S600), the controller 70 may receive the target distance Dt from the mask 51 to the wafer 10.

For example, in a case where a bar code (not illustrated) is printed on the mask 51 and the bar code contains information on the target distance Dt and information on the target wavelength $\lambda t$ of the pulse laser beam, the value of the target distance Dt may be received by reading the bar code with a bar code reader (not illustrated).

Alternatively, in a case where a bar code containing information identifying the mask 51 is printed on the mask 51, the bar code may be read. After the mask 51 has been identified, information on the target distance Dt corresponding to the mask 51 may be searched for through a database (not illustrated), and the information thus found may be received.

Alternatively, information on the target distance Dt that is inputted by an operator with a keyboard or the like (not illustrated) may be accepted by the controller 70.

The target distance Dt may be calculated, based on the pitch p of the mask 51 and the target wavelength $\lambda t$ of the pulse laser beam, as the value of an integer multiple of the Talbot distance Zt shown in Equation 1 above.

Next, in step 601 (S601), the controller 70 may set the target wavelength $\lambda t$ of the pulse laser beam at a constant value $\lambda 0$. The constant value $\lambda 0$ may for example be equal to the value of the target wavelength $\lambda t$ read from the bar code in step 600 (S600) above.

The subsequent process of step 602 (S602) and step 604 (S604) may be substantially the same as the process of step 102 (S102) and step 104 (S104) described with reference to FIG. 14, respectively.

In step 608 (S608), which follows step 604 (S604), the controller 70 may control the wafer stage 60 so that the distance MD between the mask and the wafer becomes closer to the target distance Dt. The target wavelength λt of the pulse laser beam may continue to be at the constant value λ0 without changing.

The subsequent process from step 610 (S610) to step 620 (S620) may be substantially the same as the process from step 110 (S110) to step 120 (S120) described with reference to FIG. 14, respectively.

4.5 A Fifth Method for Controlling the Laser Light Source

Figure 20:
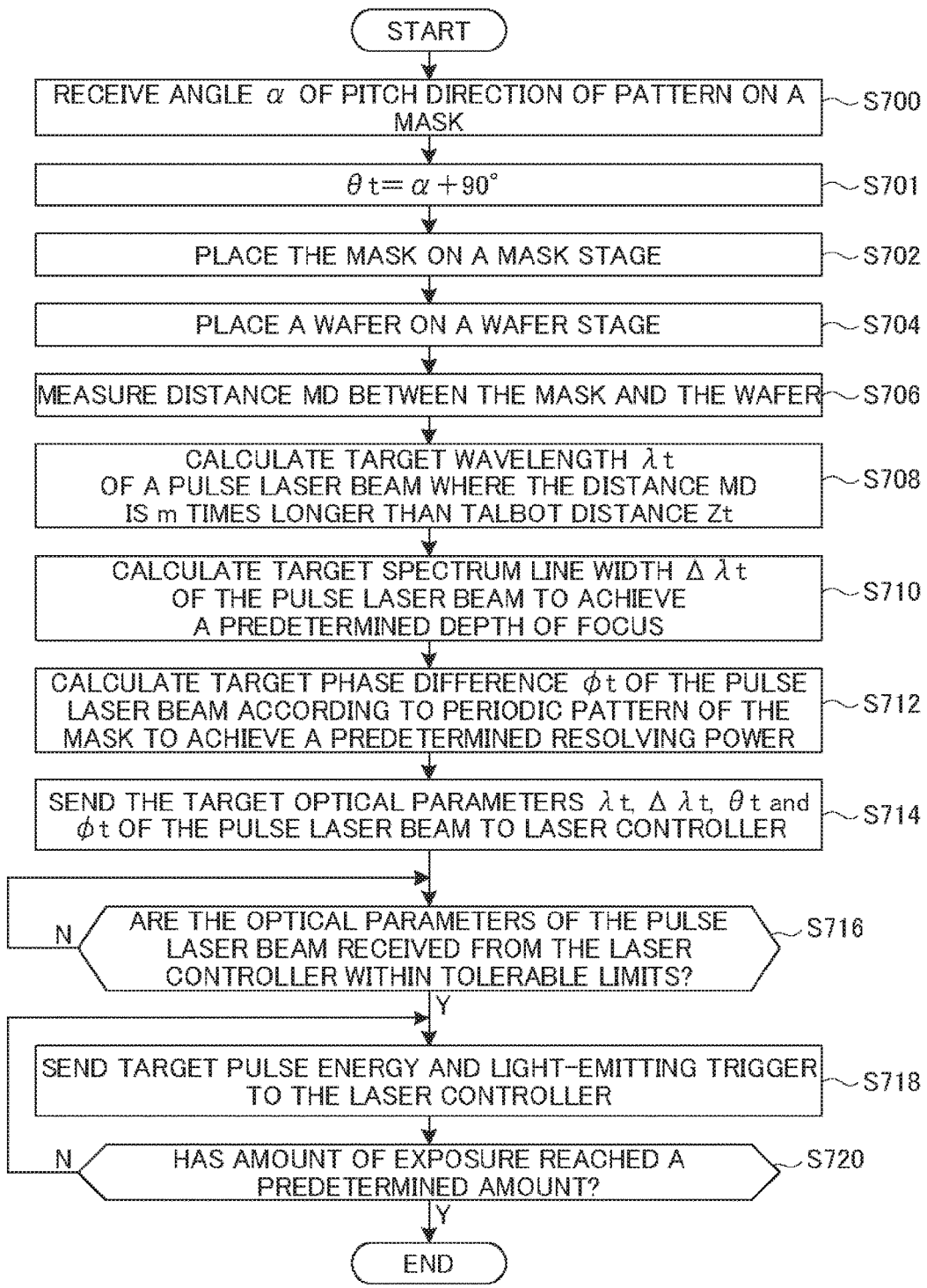
FIG. 20 is a flow chart of a fifth method for controlling the laser light source in the exposure apparatus according to the present disclosure.

Next, a fifth method for controlling the laser light source in the exposure apparatus according to the present disclosure is described with reference to FIG. 20. In this embodiment, an angle α of the pitch direction of the periodic pattern 51a on the mask 51 may be received, and the target polarization plane angle θt may be calculated based on the angle α of the pitch direction. FIG. 20 mainly shows control in the controller 70.

First, in step 700 (S700), the controller 70 may receive the angle α of the pitch direction of the periodic pattern 51a on the mask 51.

For example, in a case where a bar code (not illustrated) is printed on the mask 51 and the bar code contains information on the angle α of the pitch direction, the value of the angle α of the pitch direction may be received by reading the bar code with a bar code reader (not illustrated).

Alternatively, in a case where a bar code containing information identifying the mask 51 is printed on the mask 51, the bar code may be read. After the mask 51 has been identified, information on the angle α of the pitch direction corresponding to the mask 51 may be searched for through a database (not illustrated), and the information thus found may be received.

Alternatively, information on the angle α of the pitch direction that is inputted by an operator with a keyboard or the like (not illustrated) may be accepted by the controller 70.

Next, in step 701 (S701), a value obtained by adding 90 [deg] to the angle α of the pitch direction may be calculated as the target polarization plane angle θt. A high-contrast interference pattern can be formed by making the angle α of the pitch direction and the target polarization plane angle θt substantially perpendicular to each other.

The subsequent process of step 702 (S702) to step 720 (S720) may be substantially the same as the process of step 102 (S102) to step 120 (S120) described with reference to FIG. 14, respectively.

However, in step 712 (S712), the controller 70 may calculate only the target phase difference φt without calculating the target polarization plane angle θt. As the target polarization plane angle θt, the one calculated in step 701 (S701) may be used.

4.6 Control in the Laser Controller

Figure 21:
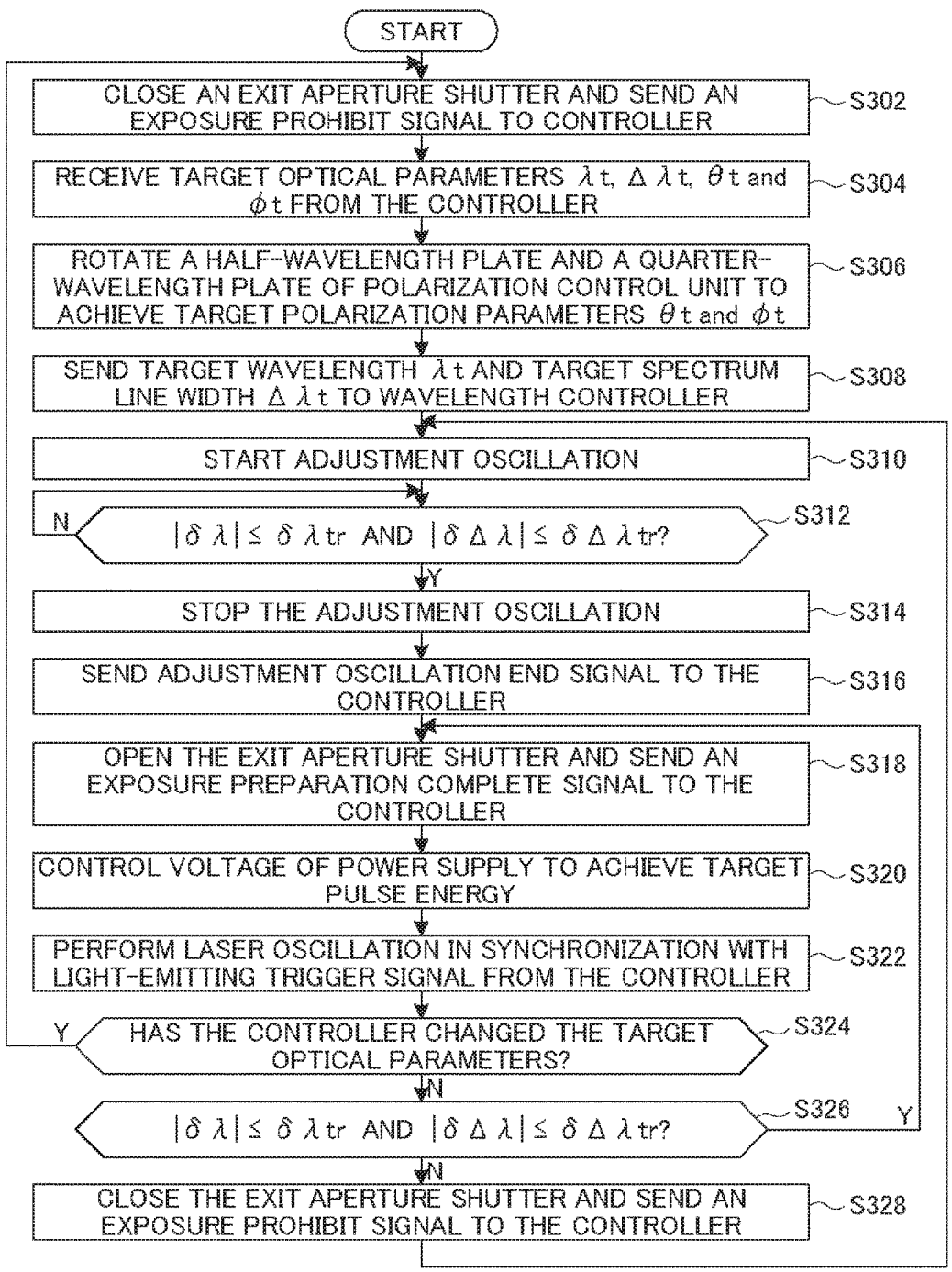
FIG. 21 is a flow chart of control in a laser controller in the exposure apparatus according to the present disclosure.

Next, control in the laser controller 130 of the laser light source 100 is described with reference to FIG. 21.

First, in step 302 (S302), the laser controller 130 may execute control to close the exit aperture shutter 119 and send an exposure prohibit signal to the controller 70.

Next, in step 304 (S304), the laser controller 130 may receive the target optical parameters from the controller 70. The target optical parameters may include the target wavelength λt, target spectrum line width Δλt, target polarization plane angle θt, and target phase difference φt of the pulse laser beam.

Next, in step 306 (S306), the laser controller 130 may execute control to rotate the half-wavelength plate 122a and the quarter-wavelength plate 122b in the polarization control unit 122. The half-wavelength plate 122a and the quarter-wavelength plate 122b may be rotated so that the polarization plane and phase difference of the pulse laser beam that is emitted from the laser light source 100 become closer to the target polarization plane angle θt and the target phase difference φt, respectively.

Next, in step 308 (S308), the laser controller 130 may send the target wavelength λt and the target spectrum line width Δλt to the wavelength controller 140.

Next, in step 310 (S310), the laser light source 100 may start adjustment oscillation.

Next, in step 312 (S312), the laser controller 130 may determine whether |δλ| is equal to or smaller than δλtr and |δΔλ| is equal to or smaller than δΔλtr. If |δλ| is equal to or smaller than δλtr and |δΔλ| is equal to or smaller than δΔλtr, the laser controller 130 may proceed to step 314. If |δλ| is greater than δλtr or |δΔλ| is greater than δΔλtr, the laser controller 130 may repeat step 312. Here, δλtr is an allowable deviation value between the wavelength λ and the target wavelength λt and δΔλtr is an allowable deviation value between the spectrum line width Δλ and the target spectrum line width Δλt.

In step 314 (S314), the laser light source 100 may stop the adjustment oscillation.

Next, in step 316 (S316), the laser controller 130 may send an adjustment oscillation end signal to the controller 70.

Next, in step 318 (S318), the laser controller 130 may execute control to open the exit aperture shutter 119 and send an exposure preparation complete signal to the controller 70.

Next, in step 320 (S320), the laser controller 130 may control the voltage to be applied between the discharge electrodes 111a and 111b by the power supply 113, in order that the pulse energy of the pulse laser beam to be emitted becomes closer to the target pulse energy.

Next, in step 322 (S322), the laser light source 100 may perform laser oscillation in synchronization with the light-emitting trigger signal from the controller 70.

Next, in step 324 (S324), the laser controller 130 may determine whether there has been a change in the target optical parameters that are calculated by the controller 70. If there has been a change in the target optical parameters, the laser controller 130 may proceed to step 302. If there has been no change in the target optical parameters, the laser controller 130 may proceed to step 326.

In step 326 (S326), the laser controller 130 may determine whether |δλ| is equal to or smaller than δλtr and |δΔλ| is equal to or smaller than δΔλtr. If |δλ| is equal to or smaller than δλtr and |δΔλ| is equal to or smaller than δΔλtr, the laser controller 130 may proceed to step 318. If |δλ| is greater than δλtr or |δΔλ| is greater than δΔλtr, the laser controller 130 may proceed to step 328.

In step 328 (S328), the laser controller 130 may execute control to close the exit aperture shutter 119 and send an exposure prohibit signal to the controller 70. After that, the laser controller 130 may proceed to step 310.

4.7 Control in the Wavelength Controller

Figure 22:
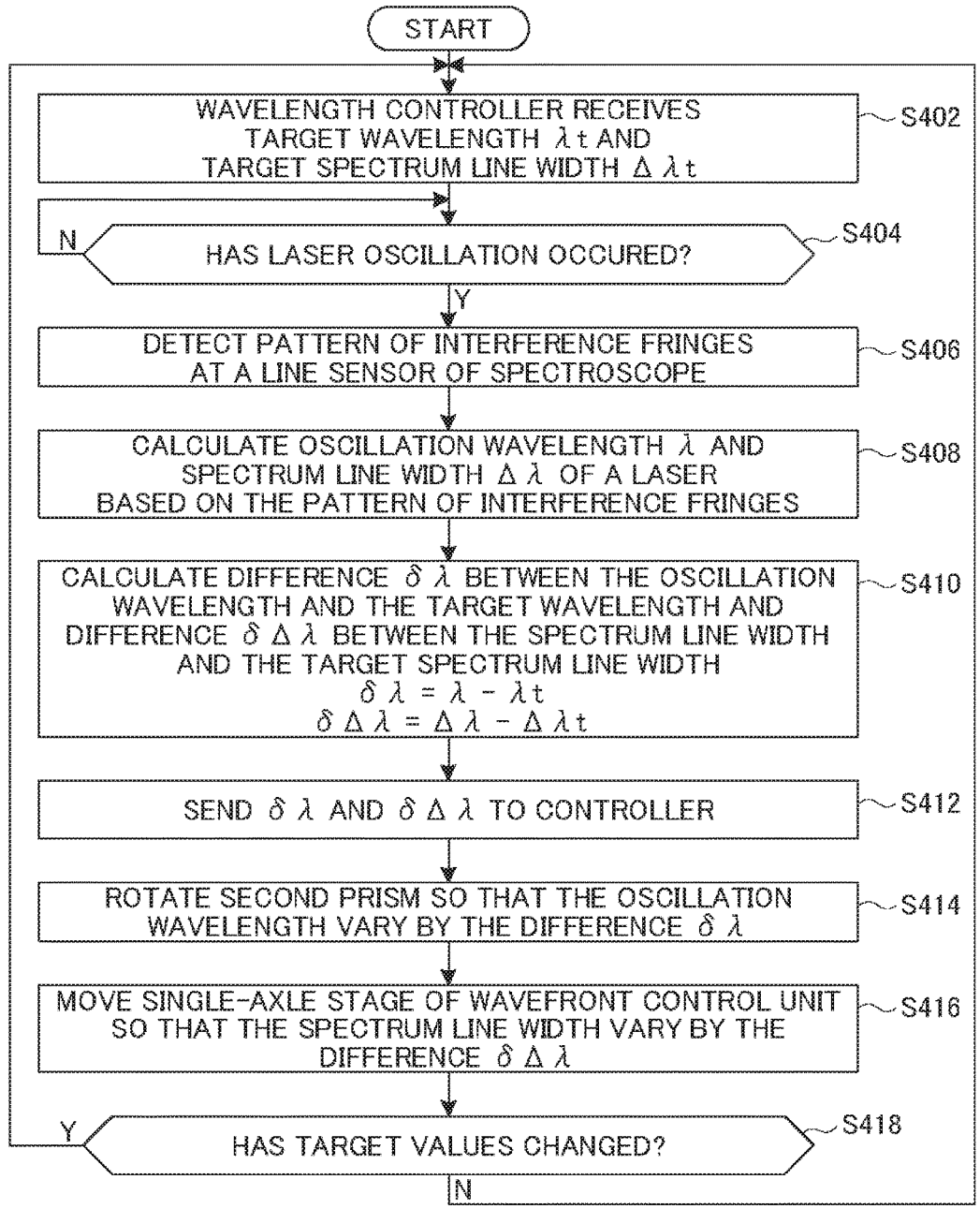
FIG. 22 is a flow chart of control in a wavelength controller in the exposure apparatus according to the present disclosure.

Next, control in the wavelength controller 140 of the laser light source 100 is described with reference to FIG. 22.

First, in step 402 (S402), the wavelength controller 140 may receive the target wavelength λt and the target spectrum line width Δλt from the laser controller 130.

Next, in step 404 (S404), the wavelength controller 140 may determine whether the laser light source 100 has performed laser oscillation. If laser oscillation has been performed, the wavelength controller 140 may proceed to step 406. If no laser oscillation has been performed, the wavelength controller 140 may repeat step 404.

In step 406 (S406), a pattern of interference fringes may be detected by the line sensor 118d of the spectroscope 118.

Next, in step 408 (S408), the wavelength controller 140 may calculate, based on the pattern of interference fringes thus detected, the oscillation wavelength λ and spectrum line width Δλ of the pulse laser beam emitted.

Next, in step 410 (S410), the wavelength controller 140 may calculate the difference δλ between the wavelength λ and target wavelength λt of the pulse laser beam and the difference δΔλ between the spectrum line width Δλ and target spectrum line width Δλt of the pulse laser beam. Specifically, the difference δλ may be calculated according to expression δλ=λ−λt, and the difference δΔλ may be calculated according to expression δΔλ=Δλ−Δλt.

Next, in step 412 (S412), the wavelength controller 140 may send the differences δλ and δΔλ to the controller 70 via the laser controller 130.

Next, in step 414 (S414), the wavelength controller 140 may execute control to rotate the second prism 114b by the rotating stage 114d in the wavelength-variable module 114 so that the wavelength λ of the pulse laser beam may vary by the difference δλ.

Next, in step 416 (S416), the wavelength controller 140 may execute control to move the cylindrical concave lens 121a by the single-axle stage 121c so that the spectrum line width Δλ of the pulse laser beam may vary by the difference δΔλ.

Next, in step 418 (S418), the wavelength controller 140 may execute control to determine whether the target wavelength λt and the target spectrum line width Δλt have been changed. If the target wavelength λt and the target spectrum line width Δλt have been changed, the wavelength controller 140 may proceed to step 402. If the target wavelength λt and the target spectrum line width Δλt have not been changed, the wavelength controller 140 may proceed to step 404.

5. Variations of the Laser Light Source

In the exposure apparatus according to the present disclosure, a laser light source of a structure other than that described above may be used.

5.1 Variation 1 of the Laser Light Source

Figure 23A:
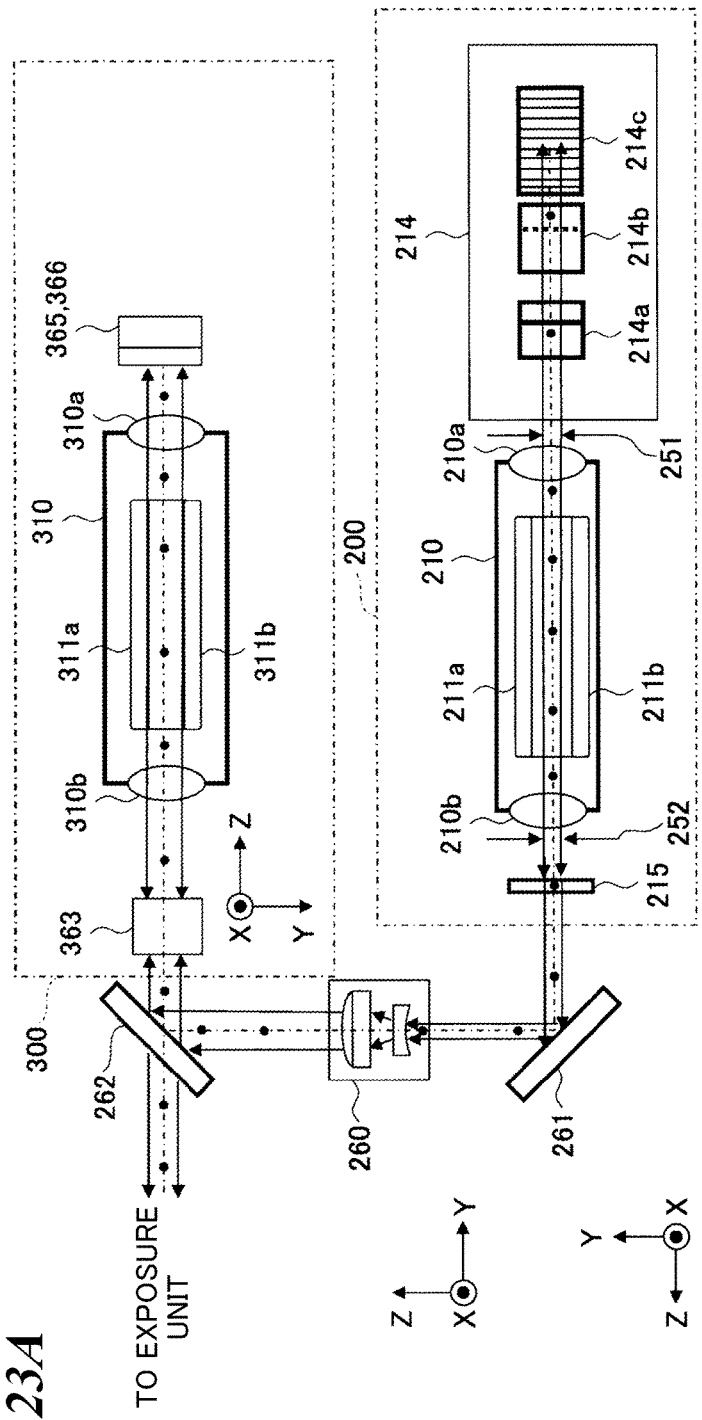
FIGS. 23A and 23B are structural drawings of Variation 1 of a laser apparatus for use in the exposure apparatus according to the present disclosure.
Figure 23B:
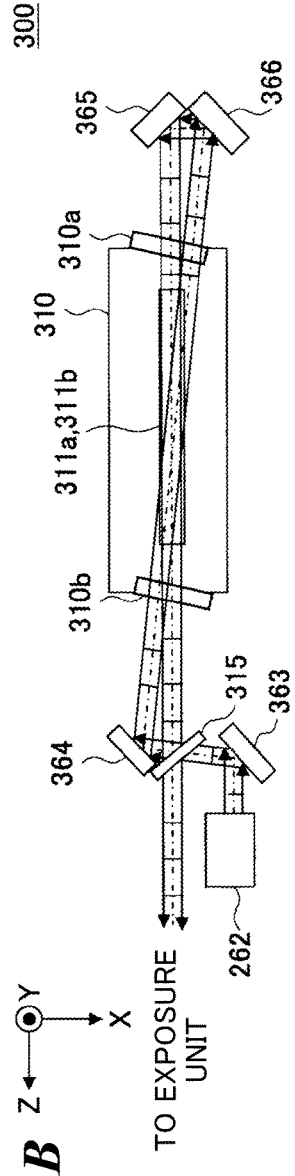

In the exposure apparatus according to the present disclosure, a laser light source of an MOPO (master oscillator power oscillator) type shown in FIGS. 23A and 23B may be used. The laser light source shown in FIGS. 23A and 23B may include an MO 200 and a PO 300. The laser light source 100 may be configured not to include the PO 300. FIG. 23A shows a side view of the laser light source and FIG. 23B shows a top view of the PO 300. In the present disclosure, the MO may sometimes be referred to as "oscillator", and the PO as "amplifier". The amplifier may be one configured to amplify the power of a laser beam emitted from the oscillator.

The MO 200 may include a partial reflection mirror 215, a wavelength-variable module 214, an MO laser chamber 210, and other components (not illustrated) such as an energy monitor, a power supply, a wavelength controller, and a laser controller.

A laser resonator may be constituted by the partial reflection mirror 215 and the wavelength-variable module 214. The wavelength-variable module 214 may include a first prism 214a, a second prism 214b, and a grating 214c.

The MO laser chamber 210 may be placed on the optical path of the laser resonator. The MO laser chamber 210 may include windows 210a and 210b and a pair of discharge electrodes 211a and 211b. The windows 210a and 210b may be disposed at a Brewster's angle. The MO laser chamber 210 may be filled with an ArF laser gas that serves as a laser gain medium. Further, for a reduction in transverse modes, aperture plates 251 and 252 having openings in central portions thereof, respectively, may be placed within the resonator of the MO 200.

A pulse laser beam emitted from the MO 200 may be reflected by a first high-reflectance mirror 261 provided between the MO 200 and the PO 300, travel through a beam expander 260, be reflected by a second high-reflectance mirror 262 to enter the PO 300.

The PO 300 may include a partial reflection mirror 315, a PO laser chamber 310, a third high-reflectance mirror 363, a fourth high-reflectance mirror 364, a fifth high-reflectance mirror 365, a sixth high-reflectance mirror 366, and other components (not illustrated) such as an energy monitor, a spectroscope, a power supply, and a laser controller.

The pulse laser beam having entered the PO 300 may be reflected by the third high-reflectance mirror 363 and transmitted through the partial reflection mirror 315 to be incident on the fourth high-reflectance mirror 364. In the PO 300, a ring laser resonator may be constituted by the partial reflection mirror 315, the fourth high-reflectance mirror 364, the fifth high-reflectance mirror 365, and the sixth high-reflectance mirror 366.

The PO laser chamber 310 may be placed on the optical path of the laser resonator. The PO laser chamber 310 may include windows 310a and 310b and a pair of discharge electrodes 311a and 311b. The windows 310a and 310b may be disposed at an approximate Brewster's angle. The PO laser chamber 310 may be filled with an ArF laser gas that serves as a laser gain medium.

A discharge space in the PO laser chamber 310 of the PO 300 may be filled with a beam of pulse laser light by placing a beam expander 260 on the optical path of a pulse laser beam between the MO 200 and the PO 300.

Figure 13:
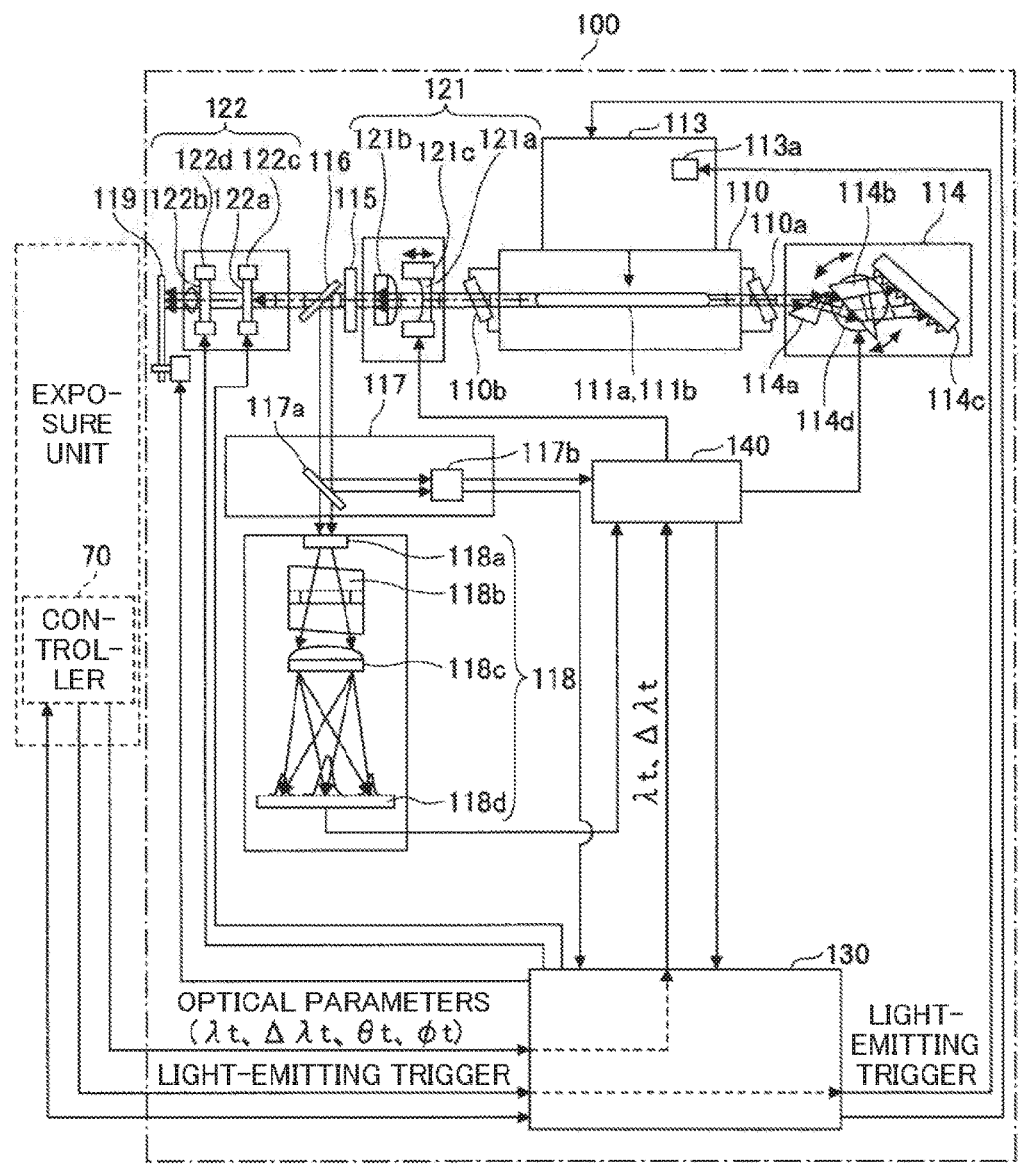
FIG. 13 is an explanatory diagram of a laser light source in the exposure apparatus according to the present disclosure.

A polarization control unit 122 such as that shown in FIG. 13 may be placed on the optical path of a pulse laser beam emitted from the PO 300. However, in a case where the windows 310a and 310b are disposed at an angle of incidence of approximately 0 degree, the polarization control unit 122 may be placed on the optical path of a pulse laser beam between the MO 200 and the PO 300.

A wavefront control unit 121 such as that shown in FIG. 13 may be placed between the partial reflection mirror 215 and the MO laser chamber 210 in the MO 200.

5.2 Variation 2 of the Laser Light Source

As shown in FIG. 24, a laser light source of an MOPO type may include, for example, a concave high-reflectance mirror 331 having a through-hole 331a in a central portion thereof and a convex high-reflectance mirror 332. The concave high-reflectance mirror 331 may function as a rear mirror of the resonator of the PO 300 and the convex high-reflectance mirror 332 may function as a front mirror of the resonator of the PO 300, to constitute an unstable resonator. By constituting an unstable resonator, temporal coherence and the direction of polarization may be equal to those of the MO 200, but spatial coherence may be higher than that of the MO 200. Further, the laser light source 100 may be configured not to include the PO 300.

Further, aperture plates 251 and 252 having openings in the central portions thereof, respectively, may be placed within the resonator of the MO 200. This may reduce the number of transverse modes of the MO 200 and make the spatial coherence higher in a Y direction as well as in an X direction.

A pulse laser beam emitted from the MO 200 may be reflected by the first high-reflectance mirror 261 and the second high-reflectance mirror 262 to enter the PO 300. The pulse laser beam having entered the PO 300 may be amplified by entering through the through-hole 331a of the concave high-reflectance mirror 331, traveling through the window 310b, and passing through the discharge region in the PO laser chamber 310. The pulse laser beam thus amplified may travel through the window 310a, be incident on the convex high-reflectance mirror 322, and be reflected by the convex high-reflectance mirror 332 so that the beam of pulse laser beam may be expanded. The beam of pulse laser light thus expanded by being reflected by the convex high-reflectance mirror 332 may enter the PO laser chamber 310 through the window 310a to be amplified in the discharge region in the PO laser chamber 310. The pulse laser beam amplified in the discharge region in the PO laser chamber 310 may travel through the window 310b and be converted into a collimated beam by being reflected by the concave high-reflectance mirror 331. The pulse laser beam thus converted into a collimated beam may again travel through the window 310b, be amplified in the discharge region in the PO laser chamber 310, travel through the window 310a, and be emitted as a pulse laser beam.

In this type of laser light source, the unstable resonator is provided for the PO 300 to expand a beam of pulse laser light. Therefore, the spatial coherence of pulse laser light may be higher than that of the laser light source of the structure shown in FIG. 13. This allows the exposure apparatus to enhance the contrast of interference fringes that are formed by the Talbot effect.

In the foregoing, a case has been described where a resonator is formed by the concave high-reflectance mirror 331 having the through-hole 331a and the convex high-reflectance mirror 332. Alternatively, the laser light source may be structured such that a resonator may be formed by a first mirror coated with a partial reflection film and a second mirror coated with a partial reflection film. The respective curvatures of the surfaces, on which the partial reflection films are formed, may be configured such that the first and second mirrors constitute an unstable resonator.

5.3 Variation 3 of the Laser Light Source

Figure 25:
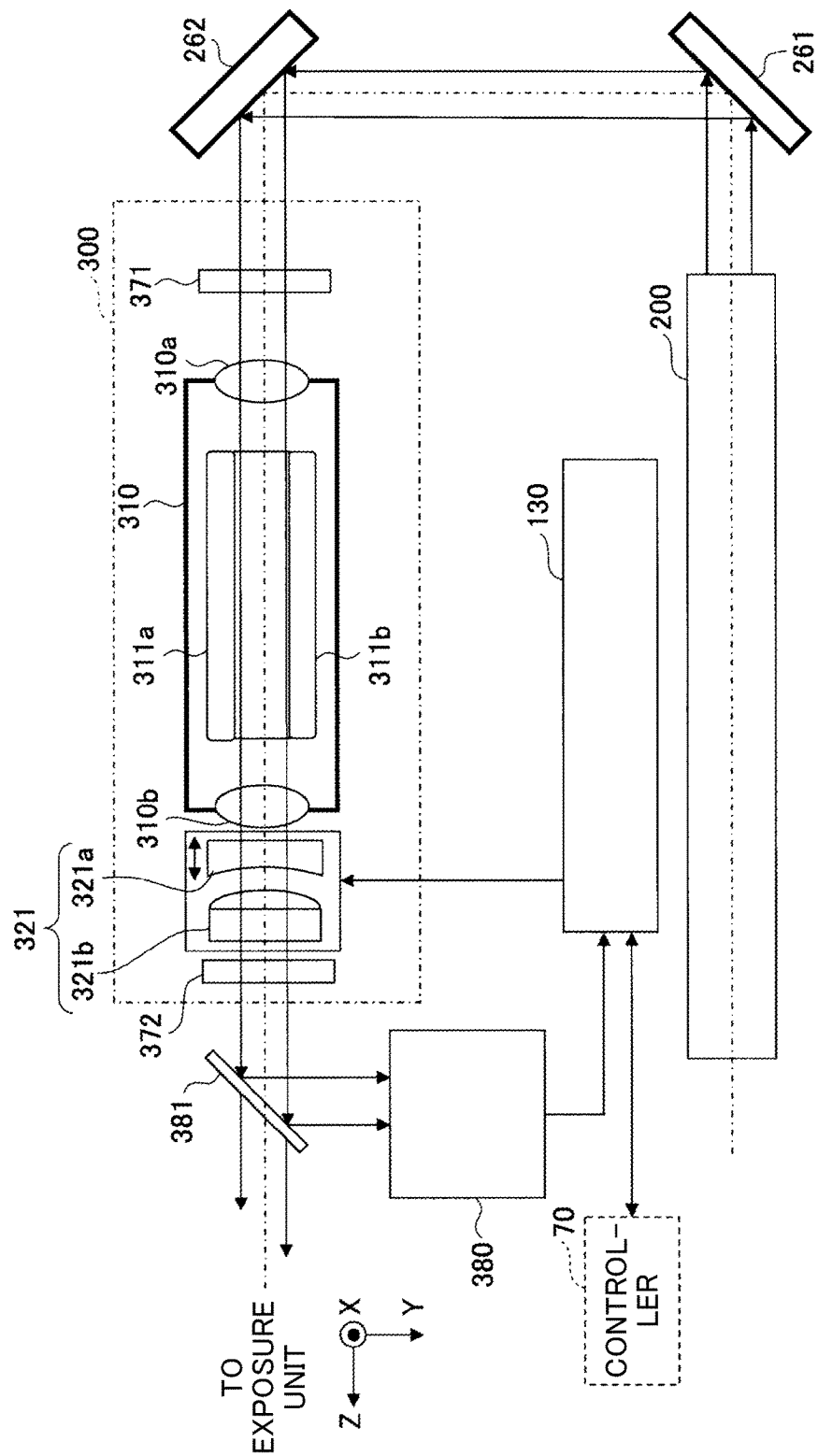
FIG. 25 is a structural drawing of Variation 3 of the laser apparatus for use in the exposure apparatus according to the present disclosure.

The laser light source 100 may use a solid-state laser light source as the MO 200. In a case where a solid-state laser light source is used as the MO 200, a pulse laser beam whose spatial transverse mode is close to 1 can be emitted. However, as a speckle pattern may be easily formed, interference fringes formed by the Talbot effect in the exposure apparatus may be affected. Therefore, as shown in FIG. 25, the laser light source 100 may include a spatial coherence adjuster 321 for converting a pulse laser beam into a pulse laser beam of optimum spatial coherence for interference exposure by the Talbot effect. The laser light source 100 may also include a coherence measuring instrument 380. A beam splitter 381 may be provided on the optical path of a pulse laser beam that is emitted from the laser light source 100, and a pulse laser beam reflected by the beam splitter 381 may enter the coherence measuring instrument 380. The laser light source 100 may be configured not to include the PO 300.

In the case of a laser light source of an MOPO type in which the PO 300 includes a resonator, temporal coherence and the direction of polarization may be equivalent to those of the MO 200, but spatial coherence depends on the type of the resonator of the PO 300.

The PO 300 may be provided with partial reflection mirrors 371 and 372, and a resonator may be constituted by the partial reflection mirrors 371 and 372. A relationship between the optical length 2L of the resonator, where L is the resonator length, and the temporal coherence Lc may satisfy expressions $2L > Lc$ and $Lc = \lambda/\Delta\lambda_m^2$, where $\Delta\lambda_m^2$ is the spectrum line width of a laser beam in the MO 200.

For example, a wavefront adjuster configured to adjust a wavefront may be provided as the spatial coherence adjuster 321 in the resonator of the PO 300. As the wavefront in the resonator is controlled, the resonator of the PO 300 can be continuously changed from a stable resonator to an unstable resonator. This may continuously change the spatial coherence of a pulse laser beam that is emitted from the PO 300.

The spatial coherence adjuster 321 may include a concave lens 321a and a convex lens 321b. The concave lens 321a and the convex lens 321b in the spatial coherence adjuster 321 may be placed on an optical path in the resonator of the PO 300. In order to adjust a wavefront by the spatial coherence adjuster 321, the concave lens 321a may be moved in an optical axis direction by using a single-axle automatic stage (not illustrated).

The coherence measuring instrument 380 may include a pinhole plate (not illustrated) provided with two pinholes placed at a fixed distance from each other. By using an image sensor to measure interference fringes of a pulse laser beam transmitted through the two pinholes, the contrast of the interference fringes may be measured.

The laser controller 130 may receive a target spatial coherence Lct from the exposure apparatus. The laser controller 130 may control the spatial coherence adjuster 321 on the basis of a result of measurement by the coherence measuring instrument 380 so that the coherence of the pulse laser beam becomes closer to the target spatial coherence Lct.

5.4 Variation 4 of the Laser Light Source

Figure 26:
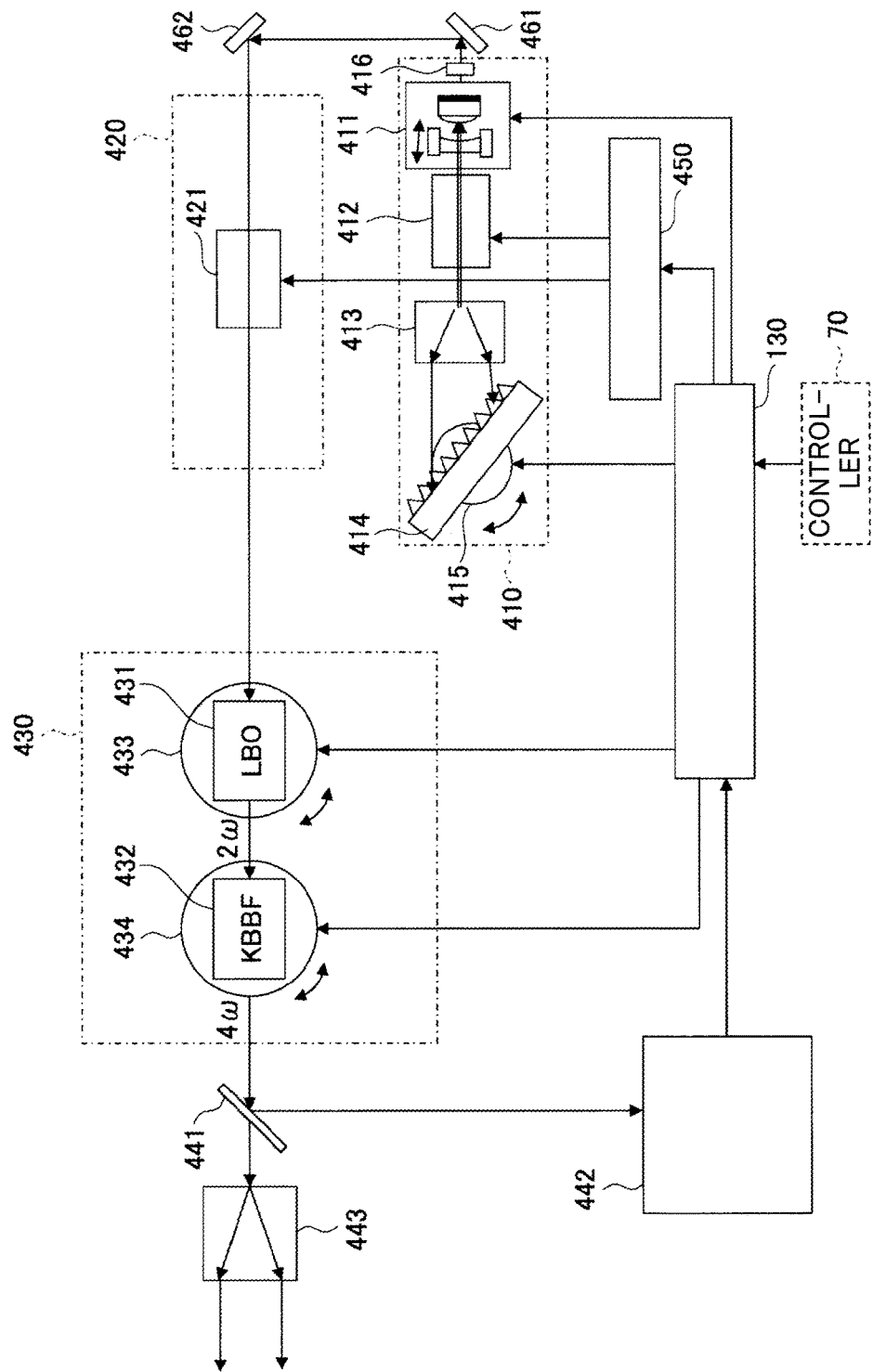
FIG. 26 is a structural drawing of Variation 4 of the laser apparatus for use in the exposure apparatus according to the present disclosure.

The laser light source may be one such as that shown in FIG. 26 in which a solid-state laser light source is used. This laser light source may include an MO 410 including a wavefront control unit 411, a titanium-sapphire crystal 412, a beam expander 413, a grating 414, a rotating stage 415 configured to rotate the grating 414, and a partial reflection mirror 416. The wavefront control unit 411 may include a cylindrical concave lens, a cylindrical convex lens, and a single-axle stage (not illustrated). Further, this laser light source may include a PA (power amplifier) 420 including a titanium-sapphire crystal 421. In this laser light source, the PA 420 may be replaced by a PO (power oscillator) including a titanium-sapphire crystal 421 and a resonator. Further, this laser light source may include a wavelength conversion mechanism 430 including an LBO crystal 431, a KBBF crystal 432, a rotating stage 433 configured to rotate the LBO crystal 431, and a rotating stage 434 configured to rotate the KBBF crystal 432. Furthermore, this laser light source may include a beam splitter 441, a spectroscope 442, and a beam expander 443. Further, this laser light source may include a pumping laser 450 for causing laser oscillation to be performed in the titanium-sapphire crystal 412. A laser beam emitted from the MO 410 may be reflected by a first high-reflectance mirror 461 and a second high-reflectance mirror 462 to enter the PA 420. This solid-state laser light source is also applicable to an MO of an ArF excimer laser.

In the laser light source shown in FIG. 26, a laser beam with a wavelength of 773.6 nm may be emitted from the MO 410 by irradiating the titanium-sapphire crystal 412 with light from the pumping laser 450. The laser beam emitted from the MO 410 may be reflected by the first high-reflectance mirror 461 and the second high-reflectance mirror 462 to enter the PA 420. In the PA 420, the laser beam with a wavelength of 773.6 nm, which passes through the titanium-sapphire crystal 421, may be amplified by irradiating the titanium-sapphire crystal 421 of the PA 420 with light from the pumping laser 450. The laser beam thus amplified may be emitted from the PA 420.

The laser beam with a wavelength of 773.6 nm, which has been emitted from the PA 420, may enter the LBO crystal 431 of the wavelength conversion mechanism 430. The laser beam may be converted into second-harmonic light with a wavelength of 386.8 nm in the LBO crystal 431, and be emitted from the LBO crystal 431. The second-harmonic light with a wavelength of 386.8 nm emitted from the LBO crystal 431 may enter the KBBF crystal 432. The second-harmonic light may be converted into fourth-harmonic light with a wavelength of 193.4 nm in the KBBF crystal 432, and be emitted from the KBBF crystal 432.

A part of the fourth-harmonic light thus emitted may be reflected by the beam splitter 441 to enter the spectroscope 442. The spectroscope 442 may measure the wavelength, spectrum line width, etc. of the incoming fourth-harmonic light. Information on the wavelength and spectrum line width thus measured may be sent to the laser controller 130. On the basis of the information on the wavelength, the laser controller 130 may rotate the grating 414 by the rotating stage 415 of the MO 410. On the basis of the information on the spectrum line width, the laser controller 130 may control the distance between the cylindrical lenses with the single-axle stage of the wavefront control unit 411.

A beam of the fourth-harmonic light that is emitted may be expanded by the beam expander 443 and enter a PO (not illustrated) or the exposure apparatus. In some cases, the beam expander 443 may be unnecessary.

6. Beam Forming Unit

Next, the beam forming unit 44 for use in the exposure apparatus according to the present disclosure is specifically described.

6.1 Example 1 of the Beam Forming Unit

Figure 27:
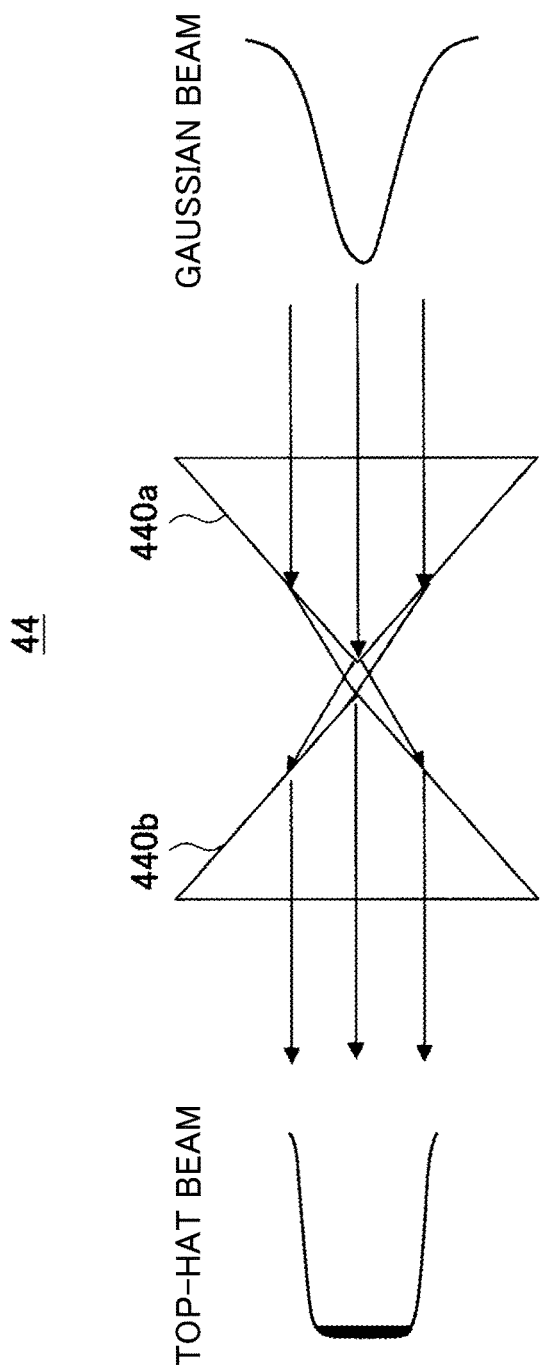
FIG. 27 is an explanatory diagram of Example 1 of a beam forming unit.

As shown in FIG. 27, the beam forming unit 44 for use in the exposure apparatus according to the present disclosure may be one including a combination of two axicon lenses 440a and 440b.

Combining the two axicon lenses 440a and 440b makes it possible to convert a Gaussian beam having a circular cross-section into a top-hat beam having a circular cross-section and emit the beam with a wavefront which is similar to that of the incoming Gaussian beam. In a case where the beam diameter of a pulse laser beam that is emitted from the beam forming unit 44 is smaller than a beam diameter that is required in a region where interference fringes are formed, a beam expander that follows the beam forming unit 44 may be combined. In a case where the laser light source outputs a laser beam of a single transverse mode, such a beam forming unit may be used to convert the light intensity distribution of the beam into a top-hat shape while substantially maintaining the wavefront.

The conversion into a top-hat shape may uniform the intensity distribution of the respective peak intensities of interference fringes that are formed on the surface of the wafer 10. As a result, the exposed energy may be uniformed, and the formation of lines and spaces may be uniformed.

6.2 Example 2 of the Beam Forming Unit

Figure 28A:
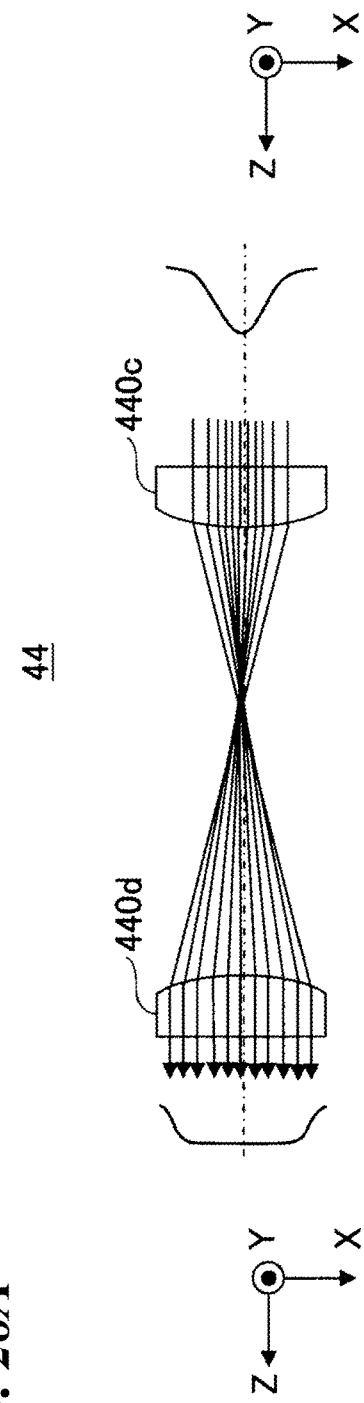
FIGS. 28A and 28B are explanatory diagrams of Example 2 of the beam forming unit.
Figure 28B:
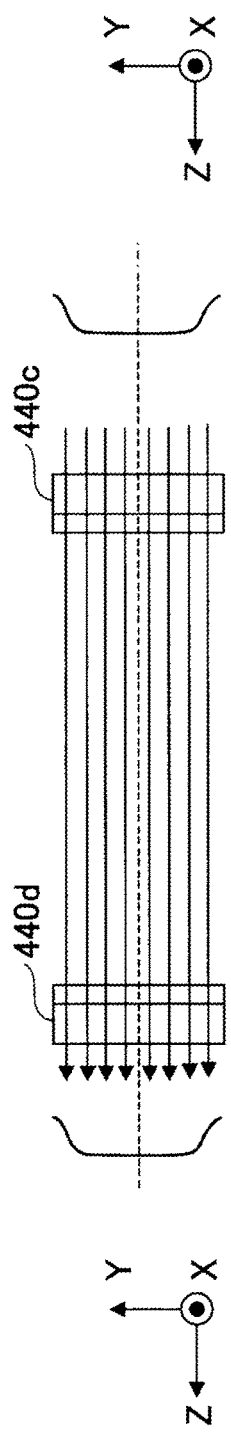

As shown in FIGS. 28A and 28B, the beam forming unit 44 for use in the exposure apparatus according to the present disclosure may be one in which two cylindrical convex lenses 440c and 440d are used.

A light intensity distribution of the cross-section of a beam that is emitted from a discharge excitation excimer laser light source may be close in shape to a Gaussian distribution in a direction (X direction) perpendicular to a discharge direction, and may be close in shape to a top-hat distribution in a direction (Y direction) parallel to the discharge direction. Therefore, as for an X-direction beam profile, the X-direction light intensity distribution may be converted by the first cylindrical convex lens 440c, and the wavefront distorted by the first cylindrical convex lens 440c may be corrected by the second cylindrical convex lens 440d. As a result, the X-direction light intensity distribution may become closer in shape to a top-hat distribution, and the wavefront may become the same as that of a plane wave.

As for a Y-direction beam profile, a beam emitted from the first cylindrical convex lens 440c and a beam emitted from the second cylindrical convex lens 440d may be equal in beam shape and wavefront to the incident beam.

By thus combining the two cylindrical convex lenses 440c and 440d, the beam profile in an X-direction of a laser beam that is emitted from the discharge excitation excimer laser light source may be converted into a top-hat shape, and may be converted into a wavefront which is close to that of a plane wave.

7. Controller

Figure 29:
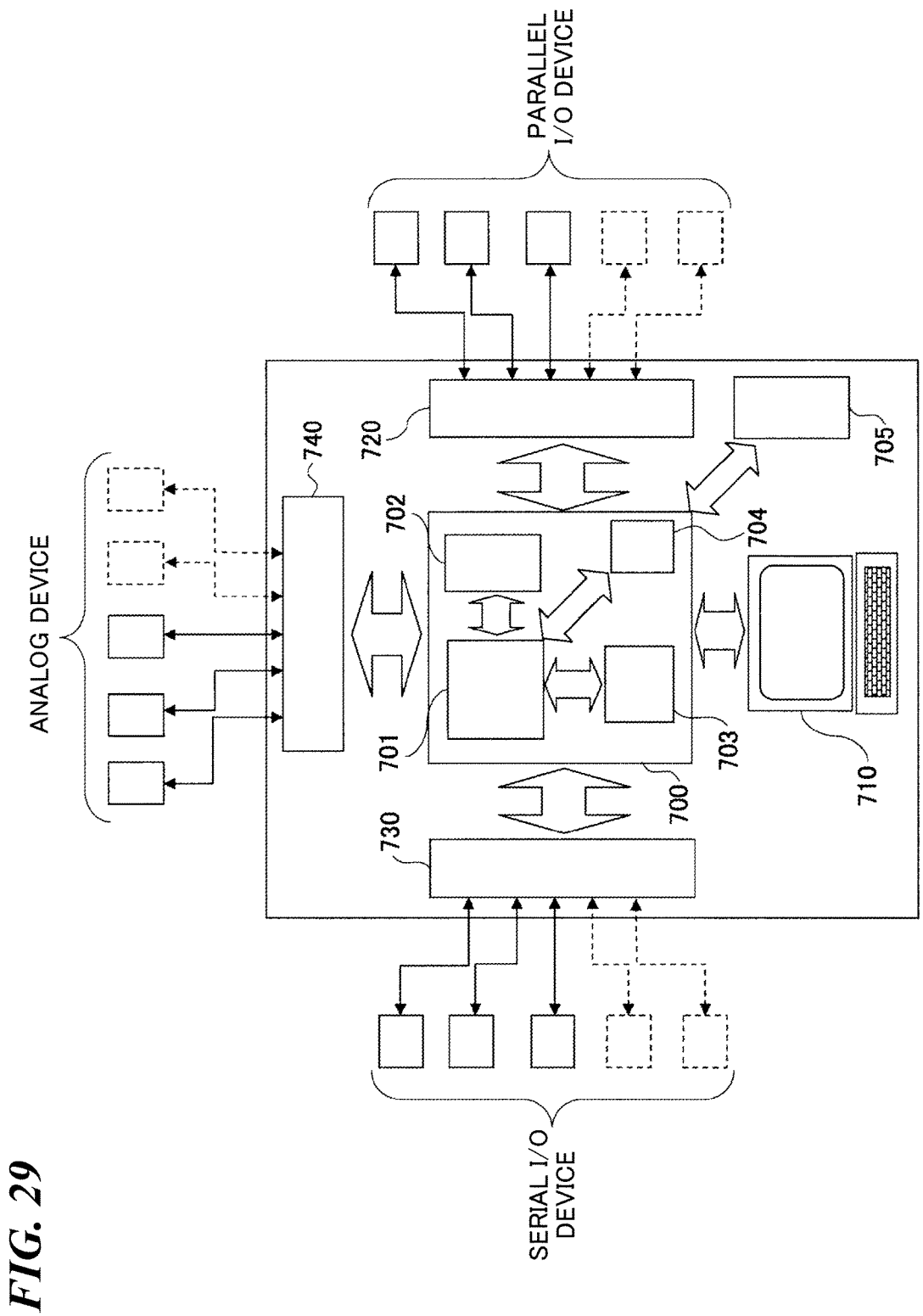
FIG. 29 is an explanatory diagram of a controller.

Next, each of the controllers such as the laser controller 130 in the laser light source 100 according to the present disclosure is described with reference to FIG. 29.

Each of the controllers such as the laser controller 130 may be constituted by a general-purpose control device such as a computer or a programmable controller. For example, the controller may be constituted as described below.

The controller may include a processing unit 700, and a storage memory 705, a user interface 710, a parallel input/output (I/O) controller 720, a serial I/O controller 730, and an analog-to-digital (A/D) and digital-to-analog (D/A) converter 740 that are connected to the processing unit 700. The processing unit 700 may include a central processing unit (CPU) 701, and a memory 702, a timer 703, and a graphics processing unit (GPU) 704 that are connected to the CPU 701.

The processing unit 700 may read out programs stored in the storage memory 705. The processing unit 700 may execute read-out programs, read out data from the storage memory 705 in accordance with the execution of the programs, or store data in the storage memory 705.

The parallel I/O controller 720 may be connected to devices communicable through parallel I/O ports. The parallel I/O controller 720 may control communication using digital signals through parallel I/O ports that is performed in the process where the processing unit 700 executes programs.

The serial I/O controller 730 may be connected to devices communicable through serial I/O ports. The serial I/O controller 730 may control communication using digital signals through serial I/O ports that is performed in the process where the processing unit 700 executes programs.

The A/D and D/A converter 740 may be connected to devices communicable through analog ports. The A/D and D/A converter 740 may control communication using analog signals through analog ports that is performed in the process where the processing unit 700 executes programs.

The user interface 710 may be configured to display progress of executing programs by the processing unit 700 to an operator or to receive instructions by the operator to the processing unit 700 to stop execution of the programs or to execute interruption processing.

The CPU 701 of the processing unit 700 may perform arithmetic processing of programs. In the process where the CPU 701 executes programs, the memory 702 may temporally store programs or temporally store data in the arithmetic process. The timer 703 may measure time or elapsed time to output the time or the elapsed time to the CPU 701 in accordance with the execution of the programs. When image data is input to the processing unit 700, the GPU 704 may process the image data in accordance with the execution of the programs and output the results to the CPU 701.

The devices communicable through parallel I/O ports, which are connected to the parallel I/O controller 720, may be various apparatuses or another controller, or the like.

The devices communicable through serial I/O ports, which are connected to the serial I/O controller 730, may be various apparatuses or another controller, or the like.

The devices communicable through analog ports, which are connected to the A/D and D/A converter 740, may be various sensors.

The descriptions above are intended to be illustrative only and the present disclosure is not limited thereto. Therefore, it will be apparent to those skilled in the art that it is possible to make modifications to the embodiments of the present disclosure within the scope of the appended claims.

The terms used in this specification and the entirety of the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" used in the specification and appended claims should be interpreted as "at least one" or "one or more."

REFERENCE SIGNS LIST

10 Wafer
20 Optical path tube
30 Frame
40 Optical system
41 First high-reflectance mirror
42 Second high-reflectance mirror
43 Third high-reflectance mirror
44 Beam forming unit
50 Mask stage
51 Mask
51*a* Periodic pattern
52 Distance sensor
60 Wafer stage
70 Controller
100 Laser light source
110 Laser chamber
110*a* Window
110*b* Window
111*a* Discharge electrode
111*b* Discharge electrode
113 Power supply
113*a* Switch
114 Wavelength-variable module
114*a* First prism
114*b* Second prism
114*c* Grating
114*d* Rotating stage
115 Partial reflection mirror
116 First beam splitter
117 Energy monitor
117*a* Second beam splitter
117*b* Pulse energy sensor
118 Spectroscope
118*a* Diffusion element
118*b* Etalon
118*c* Collector lens
118*d* Line sensor
119 Exit aperture shutter
121 Wavefront control unit
121*a* Cylindrical concave lens
121*b* Cylindrical convex lens
121*c* Single-axle stage
122 Polarization control unit
122*a* Half-wavelength plate
122*b* Quarter-wavelength plate
122*c* Rotating stage
122*d* Rotating stage
130 Laser controller
140 Wavelength controller
Zt Talbot distance

The invention claimed is:

1. An exposure apparatus configured to perform proximity exposure on a surface of a substrate, the exposure apparatus comprising:
a laser light source capable of varying a wavelength of a laser beam that is emitted from the laser light source;
a mask on which a pattern is formed, the pattern having a periodic structure and being configured to generate diffracted light by being irradiated with the laser beam, the mask being irradiated with the laser beam emitted from the laser light source; and
a controller configured to control, in accordance with a distance between the mask and the substrate, the wavelength of the laser beam that is emitted from the laser light source, wherein
the exposure is performed with light generated by interference caused by the Talbot effect; and
the controller is configured to control the wavelength of the laser beam that is emitted from the laser light source so that the distance between the mask and the substrate is equal to an integer multiple of a Talbot distance under the Talbot effect.

2. The exposure apparatus according to claim 1, wherein the controller is configured to receive a pitch of the pattern formed on the mask and control the wavelength of the laser beam on the basis of the pitch of the pattern thus received.

3. An exposure apparatus configured to perform proximity exposure on a surface of a substrate, the exposure apparatus comprising:
a laser light source capable of varying a wavelength of a laser beam that is emitted from the laser light source;
a mask on which a pattern is formed, the pattern having a periodic structure and being configured to generate diffracted light by being irradiated with the laser beam, the mask being irradiated with the laser beam emitted from the laser light source; and
a controller configured to control, in accordance with a distance between the mask and the substrate, the wavelength of the laser beam that is emitted from the laser light source, wherein
the exposure is performed with light generated by interference caused by the Talbot effect; and
the controller is configured to control a spectrum line width of the laser beam that is emitted from the laser light source so that a desired depth of focus is achieved.

4. The exposure apparatus according to claim 1, further comprising a polarization control unit configured to vary a direction of polarization of the laser beam.

5. The exposure apparatus according to claim 4, wherein the controller is configured to receive a direction of the pattern formed on the mask and control the polarization control unit on the basis of the direction of the pattern thus received.

6. The exposure apparatus according to claim 1, wherein the wavelength of the laser beam that is emitted from the laser light source is a wavelength falling within a range of 157 to 352 nm.

7. The exposure apparatus according to claim 6, wherein the laser light source is an excimer laser.

8. The exposure apparatus according to claim 7, wherein the laser light source is an ArF excimer laser.

9. The exposure apparatus according to claim 8, wherein the distance between the mask and the substrate is 825 or more times longer than the Talbot distance.

10. The exposure apparatus according to claim 7, wherein the laser light source is a KrF excimer laser.

11. The exposure apparatus according to claim 10, wherein the distance between the mask and the substrate is 509 or more times longer than the Talbot distance.

12. The exposure apparatus according to claim 1, further comprising:
 a coherence measuring device configured to measure a spatial coherence of the laser beam; and
 a spatial coherence adjuster configured to adjust the spatial coherence of the laser beam on the basis of information obtained from the coherence measuring device.

13. The exposure apparatus according to claim 1, wherein the laser light source includes an oscillator and an amplifier, the amplifier being configured to amplify a power of a laser beam emitted from the oscillator.

14. The exposure apparatus according to claim 3, further comprising a polarization control unit configured to vary a direction of polarization of the laser beam.

15. The exposure apparatus according to claim 14, wherein the controller is configured to receive a direction of the pattern formed on the mask and control the polarization control unit on the basis of the direction of the pattern thus received.

16. The exposure apparatus according to claim 3, further comprising:
 a coherence measuring device configured to measure a spatial coherence of the laser beam; and
 a spatial coherence adjuster configured to adjust the spatial coherence of the laser beam on the basis of information obtained from the coherence measuring device.

17. The exposure apparatus according to claim 3, wherein the laser light source includes an oscillator and an amplifier, the amplifier being configured to amplify a power of a laser beam emitted from the oscillator.

* * * * *